(12) United States Patent
Jeong et al.

(10) Patent No.: US 10,128,236 B2
(45) Date of Patent: Nov. 13, 2018

(54) SEMICONDUCTOR DEVICE AND METHOD FOR FABRICATING THE SAME

(71) Applicants: Ji-Min Jeong, Seoul (KR); Kee-Sang Kwon, Seoul (KR); Jin-Wook Lee, Seoul (KR); Ki-Hyung Ko, Yongin-si (KR); Sang-Jine Park, Yongin-si (KR); Jae-Jik Baek, Seongnam-si (KR); Bo-Un Yoon, Seoul (KR); Ji-Won Yun, Hwaseong-si (KR)

(72) Inventors: Ji-Min Jeong, Seoul (KR); Kee-Sang Kwon, Seoul (KR); Jin-Wook Lee, Seoul (KR); Ki-Hyung Ko, Yongin-si (KR); Sang-Jine Park, Yongin-si (KR); Jae-Jik Baek, Seongnam-si (KR); Bo-Un Yoon, Seoul (KR); Ji-Won Yun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/007,882

(22) Filed: Jan. 27, 2016

(65) Prior Publication Data
US 2016/0284699 A1 Sep. 29, 2016

(30) Foreign Application Priority Data
Mar. 23, 2015 (KR) .......................... 10-2015-0039928

(51) Int. Cl.
*H01L 29/772* (2006.01)
*H01L 27/088* (2006.01)
(Continued)

(52) U.S. Cl.
CPC .... *H01L 27/0886* (2013.01); *H01L 21/82345* (2013.01); *H01L 27/088* (2013.01);
(Continued)

(58) Field of Classification Search
CPC . H01L 27/088; H01L 27/092; H01L 27/0922; H01L 27/0924; H01L 27/0886;
(Continued)

(56) References Cited

U.S. PATENT DOCUMENTS 6,437,411 B1 8/2002 Choi et al.
6,740,550 B2 5/2004 Choi et al.
(Continued)

FOREIGN PATENT DOCUMENTS

KR 1020000062115 10/2000
KR 20110102868 9/2011
(Continued)

*Primary Examiner* — Steven Loke
*Assistant Examiner* — Scott Stowe
(74) *Attorney, Agent, or Firm* — Myers Bigel, P.A.

(57) ABSTRACT

A semiconductor device is provided. The semiconductor device includes a gate spacer that defines a trench on a substrate and includes an upper part and a lower part, a gate insulating film that extends along sidewalls and a bottom surface of the trench and is not in contact with the upper part of the gate spacer, a lower conductive film that extends on the gate insulating film along the sidewalls and the bottom surface of the trench and is not overlapped with the upper part of the gate spacer, and an upper conductive film on an uppermost part of the gate insulating film on the lower conductive film.

16 Claims, 21 Drawing Sheets

(51) Int. Cl.
*H01L 29/49* (2006.01)
*H01L 29/423* (2006.01)
*H01L 29/66* (2006.01)
*H01L 21/8234* (2006.01)

(52) U.S. Cl.
CPC .... *H01L 29/42376* (2013.01); *H01L 29/4966* (2013.01); *H01L 29/6656* (2013.01)

(58) Field of Classification Search
CPC .......... H01L 29/4966; H01L 21/82345; H01L 21/823456; H01L 29/4236; H01L 29/42372; H01L 29/42376; H01L 29/66795; H01L 29/785
See application file for complete search history.

(56) References Cited

U.S. PATENT DOCUMENTS

| | | | |
|---|---|---|---|
| 7,998,832 B2 | 8/2011 | Carter et al. | |
| 8,084,346 B1 | 12/2011 | Guo et al. | |
| 8,217,472 B2 | 7/2012 | Carter et al. | |
| 8,507,979 B1 | 8/2013 | Huang et al. | |
| 8,551,877 B2 | 10/2013 | Ranjan et al. | |
| 8,716,828 B2 | 5/2014 | Carter et al. | |
| 8,735,991 B2 | 5/2014 | Shieh et al. | |
| 8,871,597 B2 | 10/2014 | Sheih et al. | |
| 8,895,230 B2 | 11/2014 | Krishnamurthy et al. | |
| 9,209,273 B1* | 12/2015 | Lin | H01L 29/4232 |
| 9,305,923 B1* | 4/2016 | Ok | H01L 27/0924 |
| 2001/0002307 A1 | 5/2001 | Lee et al. | |
| 2012/0244693 A1 | 9/2012 | Luong et al. | |
| 2013/0224944 A1 | 8/2013 | Khanna et al. | |
| 2014/0038412 A1 | 2/2014 | Hu et al. | |
| 2014/0077203 A1 | 3/2014 | Yuan et al. | |
| 2014/0124876 A1 | 5/2014 | Kim et al. | |
| 2014/0203335 A1 | 7/2014 | Song et al. | |
| 2014/0239367 A1 | 8/2014 | Saito et al. | |
| 2014/0252536 A1 | 9/2014 | Choi et al. | |
| 2014/0356593 A1 | 12/2014 | Krishnamurthy et al. | |
| 2015/0041905 A1* | 2/2015 | Xie | H01L 29/6656 257/369 |
| 2016/0042954 A1* | 2/2016 | Sung | H01L 21/28123 257/407 |
| 2016/0086944 A1* | 3/2016 | Horak | H01L 29/66545 257/401 |
| 2017/0012107 A1* | 1/2017 | Park | H01L 29/4966 |

FOREIGN PATENT DOCUMENTS

| | | |
|---|---|---|
| KR | 1020130061616 | 6/2013 |
| KR | 1020130102505 | 9/2013 |
| KR | 20140021610 | 2/2014 |
| KR | 1020140016792 | 2/2014 |
| KR | 20140082782 | 7/2014 |
| KR | 1020140094335 | 7/2014 |
| KR | 101430180 | 8/2014 |
| KR | 1020140109136 | 9/2014 |
| WO | WO 2010/025024 | 3/2010 |
| WO | WO 2012/129005 | 9/2012 |
| WO | WO 2013/055798 | 4/2013 |
| WO | WO 2013/0097519 | 7/2014 |

\* cited by examiner

1200

1300

1400

SEMICONDUCTOR DEVICE AND METHOD FOR FABRICATING THE SAME

CROSS-REFERENCE TO RELATED APPLICATION

This application claims priority from Korean Patent Application No. 10-2015-0039928 filed on Mar. 23, 2015 in the Korean Intellectual Property Office, and all the benefits accruing therefrom under 35 U.S.C. 119, the contents of which in its entirety are herein incorporated by reference.

BACKGROUND

1. Technical Field

The present inventive concepts relates to semiconductor devices and methods for fabricating the same.

2. Description of the Related Art

Recently, functions of the semiconductor devices have also developed dramatically with the rapid diffusion of information media. In the case of the recent semiconductor products, low cost may be required to ensure competitiveness, and high integration of the product may be required for high quality. Scaling-down of the semiconductor device is progressing for high integration.

Research for increasing the operating speed of semiconductor devices and for improving the degree of integration is being conducted. Semiconductor devices may include individual elements such as MOS transistors. The gate of the MOS transistor may increasingly be reduced in accordance with the integration of semiconductor devices, and a lower channel region of the gate may also be increasingly narrowed.

Due to decrease in the interval between the gates of the transistor, an interval between the gate of the transistor and a contact formed on the source/drain of the transistor may be sharply reduced.

SUMMARY

Some aspects of the present inventive concepts provide semiconductor devices which can improve the operating performance and reliability by changing a lamination profile of an alternative metal gate electrode.

Further aspects of the present inventive concepts provide semiconductor devices which can improve the operating performance by reducing the change in height of the alternative metal gate electrode.

Still further aspects of the present inventive concepts provide methods for fabricating semiconductor devices which can improve the operating performance and reliability of the elements, by adjusting the height of the alternative metal gate material and a dielectric film having high dielectric constant.

Aspects of the present inventive concepts are not limited to the above-mentioned aspects, and other aspects that have not been mentioned will become more apparent to one of ordinary skill in the art to which the present inventive concepts pertain by referencing the detailed description of the present inventive concepts given below.

According to some embodiments of the inventive concepts, a semiconductor device includes gate spacers that define opposing sidewalls of a trench on a substrate; a gate insulating film conformally extending along the opposing sidewalls of the trench and on a surface therebetween such that portions of the gate spacers opposite the substrate are free of the gate insulating film; a lower conductive film extending on the gate insulating film along the opposing sidewalls of the trench to define a recess therein such that the portions of the gate spacers opposite the substrate are free of the lower conductive film; and an upper conductive film in the recess defined by the lower conductive film.

In some embodiments, the upper conductive film may include one or more conductive layers, and at least one of the one or more conductive layers of the upper conductive film may extend outside the recess.

In some embodiments, the upper conductive film may extend directly on the portions of the gate spacers opposite the substrate that are free of the gate insulating film and the lower conductive film.

In some embodiments, the portions of the gate spacers opposite the substrate, which are free of the gate insulating film and the lower conductive film, may be further free of the upper conductive film. The device may further include an insulating capping pattern on the upper conductive film and directly on the portions of the gate spacers that are free of the gate insulating film, the lower conductive film, and the upper conductive film.

In some embodiments, one of the gate insulating film and the lower conductive film may extend along the gate spacer away from the substrate and beyond the other of the gate insulating film and the lower conducive film.

In some embodiments, the gate insulating film may be a high-k dielectric layer. The device may further include a work function adjustment film, formed of a conductive layer that is configured to affect a threshold voltage of the semiconductor device, extending along the sidewalls of the trench and between the gate insulating film and the lower conductive film, such that the portions of the gate spacers opposite the substrate are further free of the work function adjustment film.

In some embodiments, at least one of the gate insulating film and the lower conductive film may extend along the gate spacer away from the substrate and beyond the work function adjustment film.

In some embodiments, the gate spacers, gate insulating film, lower conductive film, and upper conductive film may define a first transistor gate structure. The device may further include a second transistor gate structure on the substrate alongside the first transistor gate structure and separated therefrom by an interlayer insulating film having an etch selectivity to the gate spacers. The second transistor gate structure may include: second gate spacers that define opposing sidewalls of a second trench on a substrate; a second gate insulating film conformally extending along the opposing sidewalls of the second trench and on a surface therebetween, wherein portions of the second gate spacers opposite the substrate are free of the second gate insulating film; a second lower conductive film extending on the second gate insulating film along the opposing sidewalls of the second trench to define a second recess therein, such that the portions of the second gate spacers opposite the substrate are free of the lower conductive film; and a second upper conductive film in the second recess defined by the second lower conductive film. A width of the second trench of the second transistor gate structure may be different from that of the trench of the first transistor gate structure.

In some embodiments, the second gate insulating layer of the second transistor gate structure may extend away from the substrate beyond the gate insulating layer of the first transistor gate structure, and the second recess may extend towards the substrate beyond the recess of the first transistor gate structure.

According to an aspect of the present inventive concepts, there is provided semiconductor devices comprising a gate spacer that defines a trench on a substrate and includes an upper part and a lower part; a gate insulating film that is formed along sidewalls and a bottom surface of the trench and is not in contact with the upper part of the gate spacer; a lower conductive film that is formed on the gate insulating film along the sidewalls and the bottom surface of the trench and is not overlapped with the upper part of the gate spacer; and an upper conductive film that covers an uppermost part of the gate insulating film on the lower conductive film.

In some embodiments of the present inventive concepts, the upper conductive film fills the trench defined by the upper part of the gate spacer.

In some embodiments of the present inventive concepts, the upper conductive film is formed along a profile of the upper part of the gate spacer and a profile of the lower conductive film.

In some embodiments of the present inventive concepts, the semiconductor device may further comprise a filling conductive film formed on the upper conductive film so as to fill the trench.

In some embodiments of the present inventive concepts, a height from the bottom surface of the trench to the uppermost part of the gate insulating film is substantially equal to a height from the bottom surface of the trench to the uppermost part of the lower conductive film.

In some embodiments of the present inventive concepts, the height from the bottom surface of the trench to the uppermost part of the gate insulating film is higher than the height from the bottom surface of the trench to the uppermost part of the lower conductive film.

In some embodiments of the present inventive concepts, the semiconductor device may further comprise a work function adjustment film that is formed between the gate insulating film and the lower conductive film along the sidewalls and the bottom surface of the trench.

In some embodiments of the present inventive concepts, the height from the bottom surface of the trench to the uppermost part of the gate insulating film is higher than the height from the bottom surface of the trench to an uppermost part of the work function adjustment film.

In some embodiments of the present inventive concepts, the height from the bottom surface of the trench to the uppermost part of the gate insulating film is substantially equal to the height from the bottom surface of the trench to an uppermost part of the work function adjustment film.

In some embodiments of the present inventive concepts, the upper conductive film covers the uppermost part of the lower conductive film.

According to another aspect of the present inventive concepts, there is provided semiconductor devices comprising a gate spacer that defines a trench on a substrate and includes an upper part and a lower part; a gate insulating film that is formed along sidewalls and a bottom surface of the trench and is not in contact with the upper part of the gate spacer; a lower conductive film that is formed along the sidewalls and the bottom surface of the trench on the gate insulating film and is not in contact with the upper part of the gate spacer; and an upper conductive film that fills at least a part of a recess defined by the lower conductive film on the lower conductive film, wherein a height from the bottom surface of the trench to an uppermost part of the lower conductive film is different from a height from the bottom surface of the trench to a uppermost part of the gate insulating film, and the height from the bottom surface of the trench to the uppermost part of the lower conductive film is different from a height from the bottom surface of the trench to an uppermost part of the upper conductive film.

In some embodiments of the present inventive concepts, the semiconductor device may further comprise a capping pattern that fills the trench defined by the upper part of the gate spacer, on the upper conductive film.

In some embodiments of the present inventive concepts, a part of the capping pattern fills a part of the recess.

In some embodiments of the present inventive concepts, a part of the capping pattern is interposed between the gate insulating film and the upper conductive film.

In some embodiments of the present inventive concepts, the semiconductor device may further comprise a work function adjustment film that is formed between the gate insulating film and the lower conductive film along the sidewalls and the bottom surface of the trench.

In some embodiments of the present inventive concepts, the height from the bottom surface of the trench to the uppermost part of the gate insulating film is higher than the height from the bottom surface of the trench to an uppermost part of the work function adjustment film.

In some embodiments of the present inventive concepts, the lower conductive film covers an uppermost part of the work function adjustment film.

According to still another aspect of the present inventive concepts, there is provided semiconductor devices comprising a first gate spacer that defines a first trench on a substrate and includes an upper part and a lower part; a second gate spacer that defines a second trench on the substrate and includes an upper part and a lower part, a width of the second trench being greater than a width of the first trench; a first gate insulating film that is formed along sidewalls and a bottom surface of the first trench and is not in contact with the upper part of the first gate spacer; a second gate insulating film that is formed along sidewalls and a bottom surface of the second trench and is not in contact with the upper part of the second gate spacer, a height from the bottom surface of the second trench to an uppermost part of the second gate insulating film being different from a height from the bottom surface of the first trench to an uppermost part of the first gate insulating film; a first gate electrode that includes a first lower conductive film and a first upper conductive film on the first gate insulating film, and fills at least a part of the first trench; and a second gate electrode that includes a second lower conductive film and a second upper conductive film on the second gate insulating film, and fills at least a part of the second trench.

In some embodiments of the present inventive concepts, the first lower conductive film contains the same material as the second lower conductive film, and the first upper conductive film contains the same material as the second upper conductive film.

In some embodiments of the present inventive concepts, the first lower conductive film is formed along the sidewalls and the bottom surface of the first trench, and the first upper conductive film is formed on the first lower conductive film and covers the uppermost part of the first gate insulating film and an uppermost part of the first lower conductive film.

In some embodiments of the present inventive concepts, the first gate electrode includes a work function adjustment film formed between the first gate insulating film and the first lower conductive film, and the first lower conductive film covers an uppermost part of the work function adjustment film.

In some embodiments of the present inventive concepts, the second gate electrode further includes a filling conductive film formed on the second upper conductive film, the second lower conductive film is formed along the sidewalls and the bottom surface of the second trench, and the second upper conductive film is formed on the second lower conductive film and covers the uppermost part of the second gate insulating film.

In some embodiments of the present inventive concepts, the second gate electrode includes a work function adjustment film formed between the second gate insulating film and the second lower conductive film, and the height from the bottom surface of the second trench to an uppermost part of the work function adjustment film is substantially equal to the height from the bottom surface of the second trench to the uppermost part of the second gate insulating film.

In some embodiments of the present inventive concepts, each of the first gate electrode and the second gate electrode fills a part of the first trench and the second trench, and the semiconductor device may further comprise a first capping pattern that fills the remainder of the first trench on the first gate electrode; and a second capping pattern that fills the remainder of the second trench on the second gate electrode.

According to still another aspect of the present inventive concepts, there is provided semiconductor devices comprising a fin type pattern that protrudes upward from a field insulating film; a gate spacer that defines a trench intersecting with the fin type pattern on the field insulating film, and includes an upper part and a lower part; a gate insulating film that is formed along sidewalls and a bottom surface of the trench and is not in contact with the upper part and the gate spacer; a lower conductive film that is formed on the gate insulating film along the sidewalls and the bottom surface of the trench, and is not overlapped with the upper part of the gate spacer; and an upper conductive film that covers a uppermost part of the gate insulating film on the lower conductive film.

In some embodiments of the present inventive concepts, a height from the upper surface of the field insulating film to the uppermost part of the gate insulating film is higher than a height from the upper surface of the field insulating film to a uppermost part of the fin type pattern and is lower than a height of the gate spacer.

In some embodiments of the present inventive concepts, the upper conductive film is formed so as to fill the remainder of the trench.

According to still another aspect of the present inventive concepts, there is provided methods for fabricating semiconductor devices, the method comprising forming an interlayer insulating film, which includes a trench defined by a gate spacer, on a substrate; forming a pre gate insulating film along sidewalls and a bottom surface of the trench; forming a pre lower conductive film on the pre gate insulating film along the sidewalls and the bottom surface of the trench; forming a sacrificial pattern, which fills a part of the trench, on the pre lower conductive film; forming a gate insulating film and a lower conductive film which expose an upper part of the gate spacer, by etching a part of the pre gate insulating film and the pre lower conductive film by using the sacrificial pattern using as a mask; forming an upper conductive film that covers a uppermost part of the gate insulating film on the lower conductive film, after removing the sacrificial pattern.

In some embodiments of the present inventive concepts, the gate insulating film and the lower conductive film are simultaneously formed by an etching process.

In some embodiments of the present inventive concepts, the method may further comprise forming a protective film along a profile of the pre lower conductive film before forming the sacrificial pattern.

In some embodiments of the present inventive concepts, the protective film contains the same material as the upper conductive film.

In some embodiments of the present inventive concepts, the upper conductive film is formed so as to fill the trench.

In some embodiments of the present inventive concepts, the method may further comprise after exposing the uppermost part of the gate insulating film and the uppermost part of the gate spacer by removing a part of the upper conductive film, forming a capping pattern that fills the trench on the gate insulating film and the upper conductive film.

In some embodiments of the present inventive concepts, the upper conductive film is formed along a profile of the upper part of the gate spacer and a profile of the lower conductive film.

In some embodiments of the present inventive concepts, the method may further comprise forming a filling conductive film that fills the trench on the upper conductive film.

In some embodiments of the present inventive concepts, the method may further comprise after exposing the uppermost part of the gate insulating film and the upper part of the gate spacer by removing a part of the filling conductive film and the upper conductive film, forming a capping pattern that fills the trench on the gate insulating film, the upper conductive film and the filling conductive film.

In some embodiments of the present inventive concepts, the method may further comprise before forming the pre lower conductive film, forming a work function adjustment film on the pre gate insulating film along a part of the sidewalls and the bottom surface of the trench. The pre lower conductive film covers a uppermost part of the work function adjustment film.

According to still another aspect of the present inventive concepts, there is provided methods for fabricating semiconductor devices, the method comprising forming an interlayer insulating film including a first trench and a second trench on a substrate, a width of the second trench being greater than the first trench, and each of the first and second trench being defined by a first gate spacer and a second gate spacer; forming a pre gate insulating film along sidewalls and a bottom surface of the first trench and sidewalls and a bottom surface of the second trench; forming a pre lower conductive film on the pre gate insulating film along the sidewalls and the bottom surface of the first trench and the sidewalls and the bottom surface of the second trench; forming a first sacrificial pattern for filling a part of the first trench and a second sacrificial pattern for filling a part of the second trench on the pre lower conductive film, respectively, a height from the bottom surface of the first trench to an upper surface of the first sacrificial pattern being different from a height from the bottom surface of the second trench to an upper surface of the second sacrificial pattern; forming a first gate insulating film and a first lower conductive film which expose an upper part of the first gate spacer, by etching the pre gate insulating film and the pre lower conductive film by using the first sacrificial pattern as a mask; forming a second gate insulating film and a second lower conductive film which expose an upper part of the second gate spacer, by etching the pre gate insulating film and the pre lower conductive film by using the second sacrificial pattern as a mask; after removing the first sacrificial pattern, forming a first upper conductive film, which covers a uppermost part of the first gate insulating film, on the first lower conductive film; and after removing the second sacrificial pattern, forming a second upper conductive film, which covers a uppermost part of the second gate insulating film, on the second lower conductive film.

In some embodiments of the present inventive concepts, the height from the bottom surface of the first trench to the upper surface of the first sacrificial pattern is higher than the height from the bottom surface of the second trench to the upper surface of the second sacrificial pattern.

In some embodiments of the present inventive concepts, the method may further comprise before forming the free lower conductive film, forming a first work function adjustment film on the pre gate insulating film, along a part of the sidewalls and the bottom surface of the first trench. The pre lower conductive film covers a uppermost part of the first work function adjustment film.

In some embodiments of the present inventive concepts, the first upper conductive film is formed so as to fill the first trench, and the second upper conductive film is formed along a profile of the upper part of the second gate spacer and a profile of the second lower conductive film.

In some embodiments of the present inventive concepts, the method may further comprise forming a filling conductive film, which fills the second trench, on the second upper conductive film.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EMBODIMENTS

Figure 1:
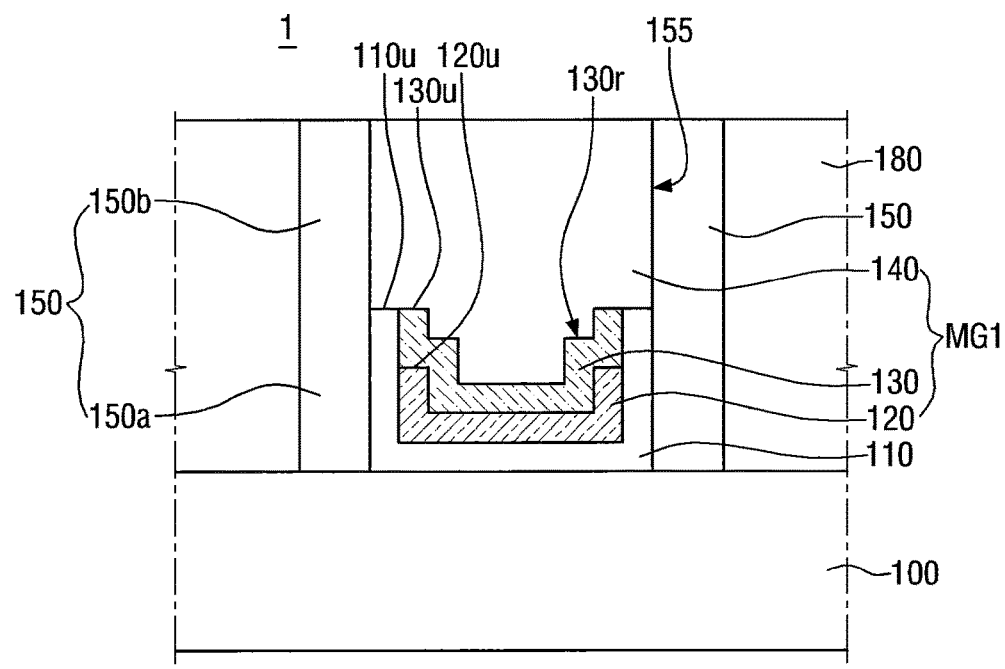
FIG. 1 is a diagram illustrating semiconductor devices according to a first embodiment of the present inventive concepts.

Advantages and features of the present inventive concepts and methods of accomplishing the same may be understood more readily by reference to the following detailed description of embodiments and the accompanying drawings. The present inventive concepts may, however, be embodied in many different forms and should not be construed as being limited to embodiments set forth herein. Rather, these embodiments are provided so that this disclosure will be thorough and complete and will fully convey the concept of the present inventive concepts to those skilled in the art, and the present inventive concepts will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present. When an element or layer is "free of" another element or layer, the elements or layers are not directly on or in direct contact with one another.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating semiconductor devices according to a first embodiment of the present inventive concepts. For convenience of explanation, source/drain regions, an element isolation film such as shallow trench isolation (STI) and the like formed in the substrate will not be illustrated; however, it will be understood that such elements may be included in embodiments described herein.

Referring to FIG. 1, semiconductor devices 1 according to a first embodiment of the present inventive concepts can include a first gate spacer 150, a first trench 155, a first gate insulating film 110, a first gate electrode MG1 and the like. The first gate electrode MG1 can include a first work function adjustment film 120, a first lower conductive film 130, a first upper conductive film 140 and the like.

The substrate 100 can be a bulk silicon or a silicon-on-insulator (SOI). Alternatively, the substrate 100 may be a silicon substrate or may contain other materials, for example, germanium, silicon germanium, indium antimonide, lead telluride, indium arsenide, indium phosphide, gallium arsenide or gallium antimonide, but is not limited thereto.

The first gate spacer 150 can be formed on the substrate 100. The first gate spacer 150 can include an upper part 150b and a lower part 150a. The upper part 150b of the first gate spacer and the lower part 150a of the first gate spacer can be classified depending on whether they are in contact with a first gate insulating film 110 to be described below.

The first gate spacer 150 can contain, for example, at least one of silicon nitride, silicon oxynitride, silicon oxide and combinations thereof.

Further, in some cases, the first gate spacer 150 can serve as a guide for forming a self-aligned contact. Therefore, the first gate spacer 150 can contain a material having an etching selectivity to an interlayer insulation film 180 to be described below.

The first trench 155 can be defined by the first gate spacer 150. For example, in the first trench 155, the opposite sidewalls of the trench can be formed by the first gate spacer 150, and a bottom surface of the trench can be formed by an upper surface of the substrate 100.

The interlayer insulating film 180 can be formed on the substrate 100. The interlayer insulating film 180 may extend on or surround the outer sidewalls of the first gate spacer 150 that defines the first trench 155.

The interlayer insulating film 180 can contain, for example, at least one of silicon oxide, silicon nitride, silicon oxynitride and a low dielectric constant material having the dielectric constant lower than silicon oxide. The low dielectric constant material can contain, for example, but not limited to, Flowable Oxide (FOX), Torene SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), silk, polyimide, porous polymeric material or combinations thereof.

The first gate insulating film 110 can be formed along the sidewalls and the bottom surface of the first trench 155. The first gate insulating film 110 can be formed along a part of the sidewalls of the first trench 155 rather than being formed along the entire sidewalls of the first trench 155.

The first gate insulating film 110 is in contact with the lower part 150a of the first gate spacer but may not be in contact with the upper part 150b of the first gate spacer. That is, a height from the bottom surface of the first trench 155 to an uppermost part 110u of the first gate insulating film can be lower than a height of the first gate spacer 150. Portions of the first gate spacer 150 opposite the substrate 100 are free of the first gate insulating film 110.

The first gate insulating film 110 can include a high dielectric constant dielectric film. The high dielectric constant dielectric film can contain, for example (but is not limited to), one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Although it is not illustrated, an interfacial film can be formed along the bottom surface of the first trench 155 between the substrate 100 and the first gate insulating film 110.

The first work function adjustment film 12Q can be formed on the first gate insulating film 110. The first work function adjustment film 120 can be formed along a part of the sidewalls of the first trench 155 and the bottom surface of the first trench 155.

Since the first work function adjustment film 120 is formed in the first trench 155 in which the first gate insulating film 110 is formed, the first work function adjustment film 120 can be formed to conformally extend along the profile of the first gate insulating film 110.

The height from the bottom surface of the first trench 155 to the uppermost part 110$u$ of the first gate insulating film can be different from the height from the bottom surface of the first trench 155 to the uppermost part 120$u$ of the first work function adjustment film. In the semiconductor device according to the first embodiment of the present inventive concepts, the height from the bottom surface of the first trench 155 to the uppermost part 110$u$ of the first gate insulating film may be higher than the height from the bottom surface of the first trench 155 to the uppermost part 120$u$ of the first work function adjustment film.

The first work function adjustment film 12Q may be a p-type work function adjustment film or an n-type work function adjustment film. The first work function adjustment film 120 can contain, for example, at least one of TiN, TaN and combinations thereof. For example, in the case of a laminated film of TiN and TaN, TiN can be formed so as to come into contact with the first gate insulating film 110, and TaN can be formed so as to come into contact with TiN on TiN.

Depending on whether the semiconductor device 1 is either a PMOS or an NMOS, the thickness of the first work function adjustment film 120 and/or a laminated structure of materials may vary.

The first lower conductive film 130 can be formed on the first work function adjustment film 120. The first lower conductive film 130 can be formed along a part of the sidewalls of the first trench 155 and the bottom surface of the first trench 155.

The first work function adjustment film 120 can be formed between the first lower conductive film 130 and the first gate insulating film 110. That is, since the first lower conductive film 130 is formed in the first trench 155 in which the first work function adjustment film 120 is formed, a part of the first lower conductive film 130 can be formed along the profile of the first work function adjustment film 120.

In the semiconductor device according to the first embodiment of the present inventive concepts, the first lower conductive film 130 can extend on or cover the uppermost part 120$u$ of the first work function adjustment film. The height from the bottom surface of the first trench 155 to the uppermost part 130$u$ of the first lower conductive film can be higher than the height from the bottom surface of the first trench 155 to the uppermost part 120$u$ of the first work function adjustment film.

Further, in the semiconductor device according to the first embodiment of the present inventive concepts, the height from the bottom surface of the first trench 155 to the uppermost part 130$u$ of the first lower conductive film can be substantially equal to the height from the bottom surface of the first trench 155 to the uppermost part 110$u$ of the first gate insulating film. That is to say, the first lower conductive film 130 may not be overlapped with the upper part 150$b$ of the first gate spacer. The portions of the first gate spacer 150 opposite the substrate are free of the first lower conductive film 130.

Here, the meaning of the expression "the heights are equal" includes a minute difference in height which may occur due to a process error or the like as well as the meaning in which the heights are completely equal to each other at the two comparative positions.

Also, on the basis of the bottom surface of the first trench 155, the height of the uppermost part 110$u$ of the first gate insulating film is equal to the height of the uppermost part 130$u$ of the first lower conductive film, and since the first gate insulating film 110 is interposed between the first gate spacer 150 and the first lower conductive film 130, the first lower conductive film 130 may not be in contact with the upper part 150$b$ of the first gate spacer.

The first lower conductive film 130 can contain a material that affects or adjusts a threshold voltage of the semiconductor device and can contain, for example, TiAlC.

The first upper conductive film 140 can be formed on the first lower conductive film 130. The first upper conductive film 140 can fill the first trench 155.

More specifically, the first upper conductive film 140 can fill the remainder of the first trench 155 that is left after the first gate insulating film 110, the first work function adjustment film 120 and the first lower conductive film 130 are formed. The first upper conductive film 140 can fill a first trench 155 portion defined by the upper part 150$b$ of the first gate spacer, and a first recess 130$r$ defined along the profile of the first lower conductive film 130. At least of the first upper conductive film 140 may extend outside of the first recess 130$r$.

The first upper conductive film 140 can extend on or cover the uppermost part 110$u$ of the first gate insulating film and the uppermost part 130$u$ of the first lower conductive film. Therefore, on the basis of the bottom surface of the first trench 155, the height of the uppermost part of the first upper conductive film 140 is higher than the height of the uppermost part 110$u$ of the first gate insulating film and the height of the uppermost part 130$u$ of the first lower conductive film. The first upper conductive film 140 may extend directly on the portions of first gate spacer 150 opposite the substrate 100 that are free of the first gate insulating film 110 and the first lower conductive film 130.

In the semiconductor device 1 according to the first embodiment of the present inventive concepts, the first upper conductive film 140 can serve as a filling film.

The first upper conductive film 140 can contain a material that can improve the adhesion with the first lower conductive film 130 and can contain, for example, TiN.

As illustrated, in the semiconductor device according to the first embodiment of the present inventive concepts, the upper surface of the first upper conductive film 140 can be placed on the same plane as or coplanar with the upper surface of the interlayer insulating film 180 and the upper surface of the first gate spacer 150.

Figure 2:
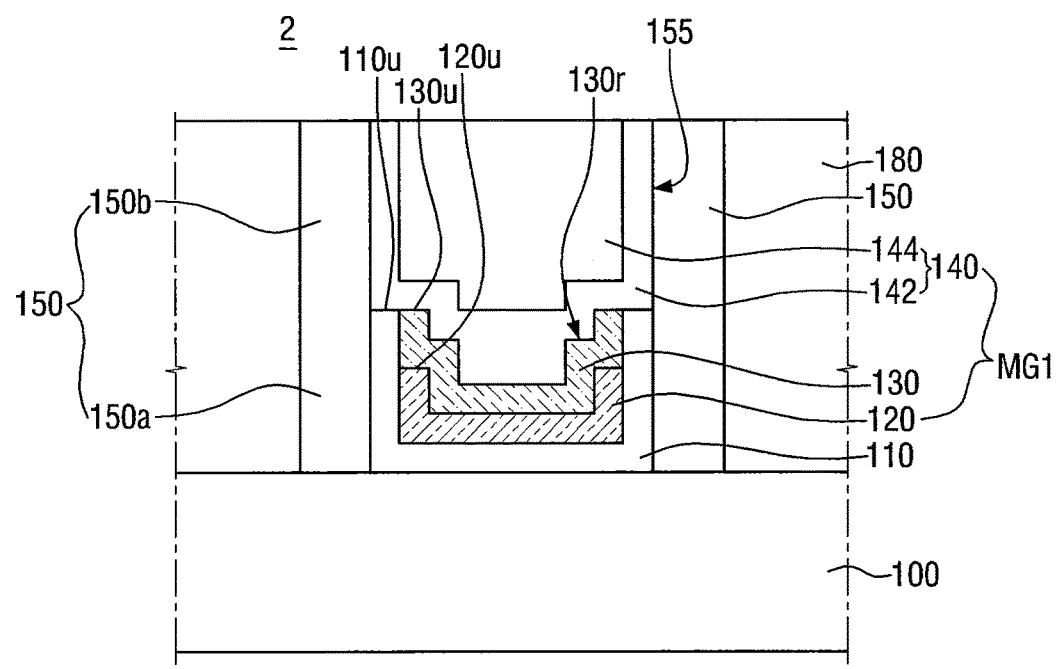
FIG. 2 is a diagram illustrating semiconductor devices according to a second embodiment of the present inventive concepts.

FIG. 2 is a diagram illustrating semiconductor devices according to a second embodiment of the present inventive concepts. For convenience of description, differences from the description of FIG. 1 will be mainly described.

Referring to FIG. 2, in semiconductor devices 2 according to a second embodiment of the present inventive concepts, the first upper conductive film 140 can include a first lower filling film 142 and a first upper filling film 144. The first lower filling film 142 and the first upper filling film 144 can be sequentially formed on the first lower conductive film 130.

The first lower filling film 142 can be formed along the profile of the upper part 150b of the first gate spacer and the profile of the first lower conductive film 130. That is, the first lower filling film 142 can be formed along the profile of the upper part 150b of the first gate spacer and the first recess 130r.

The first lower filling film 142 can contain a material capable of improving the adhesion between the first lower conductive film 130 and the first upper filling film 144, and can contain, for example, TiN.

The first upper filling film 144 can be formed on the first lower filling film 142. The first upper filling film 144 can be formed so as to fill the remainder of the first trench 155 that is left after the first lower filling film 142 is formed.

The first upper filling film 144 can serve as a filling film that fills the first trench 155 and can contain, for example, tungsten (W), aluminum (Al), cobalt (Co) or the like, but is not limited thereto.

Figure 3:
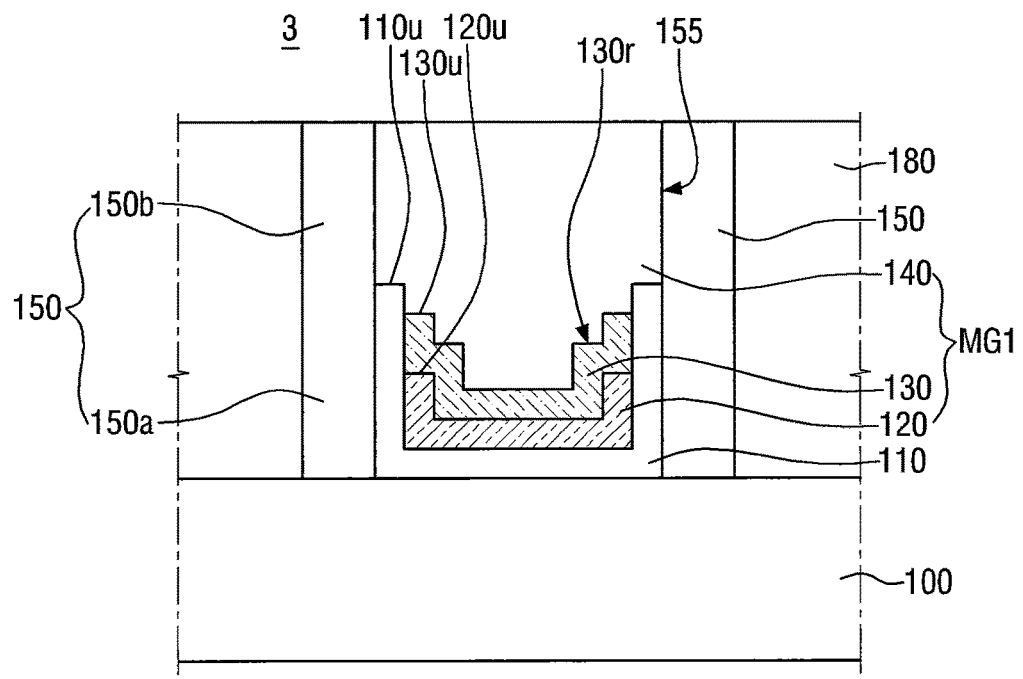
FIG. 3 is a diagram illustrating semiconductor devices according to a third embodiment of the present inventive concepts.

FIG. 3 is a diagram illustrating semiconductor devices according to a third embodiment of the present inventive concepts. For convenience of explanation, differences from the description of FIG. 1 will be mainly described.

Referring to FIG. 3, in semiconductor devices 3 according to the third embodiment of the present inventive concepts, the height from the bottom surface of the first trench 155 to the uppermost part 110u of the first gate insulating film can be different from the height from the bottom surface of the first trench 155 to the uppermost part 130u of the first lower conductive film.

More specifically, the height from the bottom surface of the first trench 155 to the uppermost part 110u of the first gate insulating film can be higher than the height from the bottom surface of the first trench 155 to the uppermost part 130u of the first lower conductive film.

On the basis of the bottom surface of the first trench 155, although the height of the uppermost part 130u of the first lower conductive film is lower than the height of the uppermost part 110u of the first gate insulating film, the first lower conductive film 130 can extend on or cover the uppermost part 120u of the first work function adjustment film.

Figure 4:
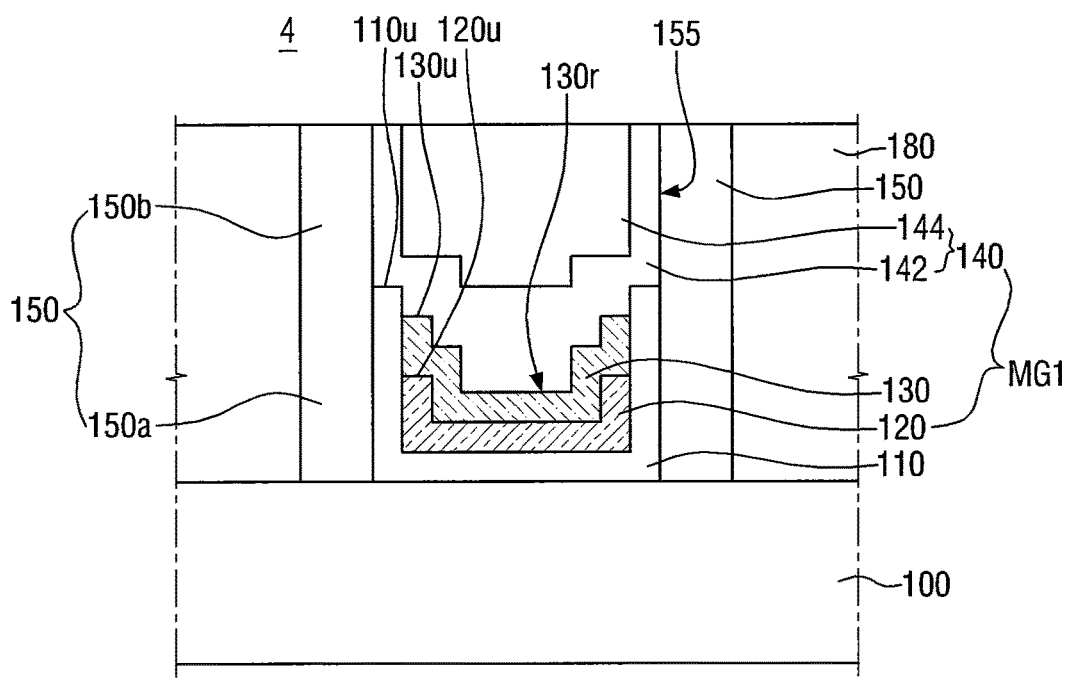
FIG. 4 is a diagram illustrating semiconductor devices according to a fourth embodiment of the present inventive concepts.

FIG. 4 is a diagram illustrating semiconductor devices according to a fourth embodiment of the present inventive concepts. For convenience of description, differences from the descriptions of FIGS. 1 to 3 will be mainly described.

Referring to FIG. 4, in semiconductor devices 4 according to a fourth embodiment of the present inventive concepts, a first upper conductive film 140 can include a first lower filling film 142 and a first upper filling film 144.

The first lower filling film 142 and the first upper filling film 144 can be sequentially formed on the first lower conductive film 130.

Figure 5:
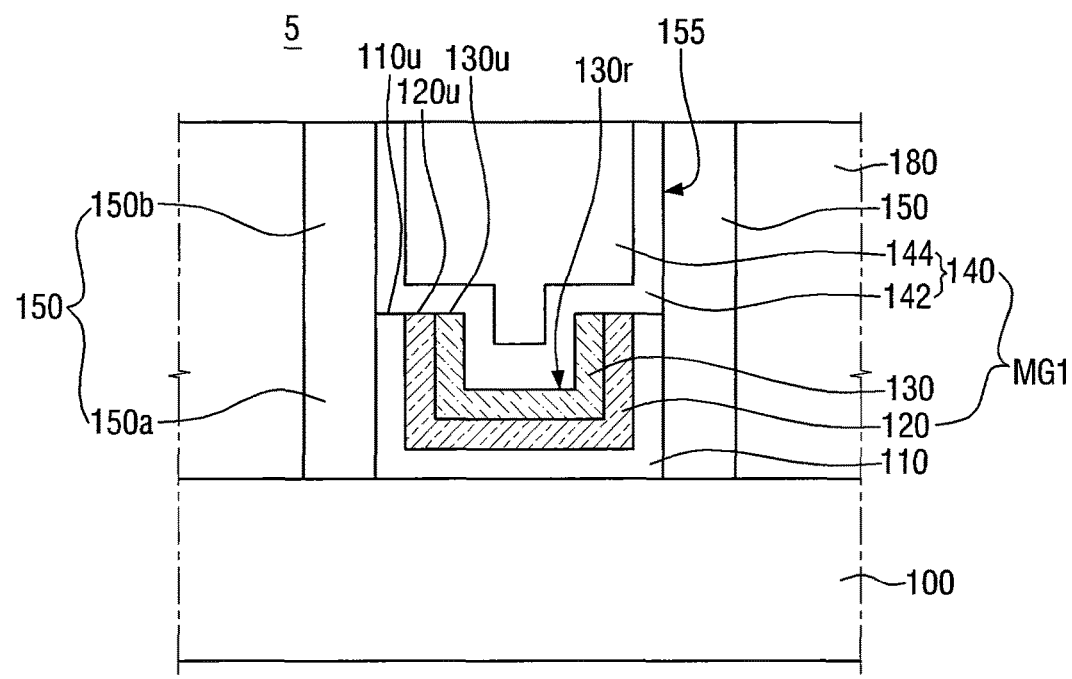
FIG. 5 is a diagram illustrating semiconductor devices according to a fifth embodiment of the present inventive concepts.

FIG. 5 is a diagram illustrating semiconductor devices according to a fifth embodiment of the present inventive concepts. For convenience of description, differences from the descriptions of FIGS. 1 and 2 will be mainly described.

Referring to FIG. 5, in semiconductor devices 5 according to a fifth embodiment of the present inventive concepts, the height from the bottom surface of the first trench 155 to the uppermost part 110u of the first gate insulating film can be substantially equal to the height from the bottom surface of the first trench 155 to the uppermost part 120u of the first work function adjustment film.

Also, the height from the bottom surface of the first trench 155 to the uppermost part 130u of the first lower conductive film can be substantially equal to the height from the bottom surface of the first trench 155 to the uppermost part 120u of the first work function adjustment film. That is, the first lower conductive film 130 may not extend on or cover the uppermost part 120u of the first work function adjustment film.

As illustrated, on the basis of the bottom surface of the first trench 155, the height of the uppermost part 110u of the first gate insulating film, the height of the uppermost part 120u of the first work function adjustment film, and the height of the uppermost part 130u of the first lower conductive film may be at the substantially same position. That is, the uppermost part 110u of the first gate insulating film, the uppermost part 120u of the first work function adjustment film, and the uppermost part 130u of the first lower conductive film may be placed on the same plane.

The first lower filling film 142 can be formed conformally extending along the profile of the upper part 150b of the first gate spacer, the uppermost part 110u of the first gate insulating film, the uppermost part 120u of the first work function adjustment film and the profile of the first lower conductive film 130.

Figure 6:
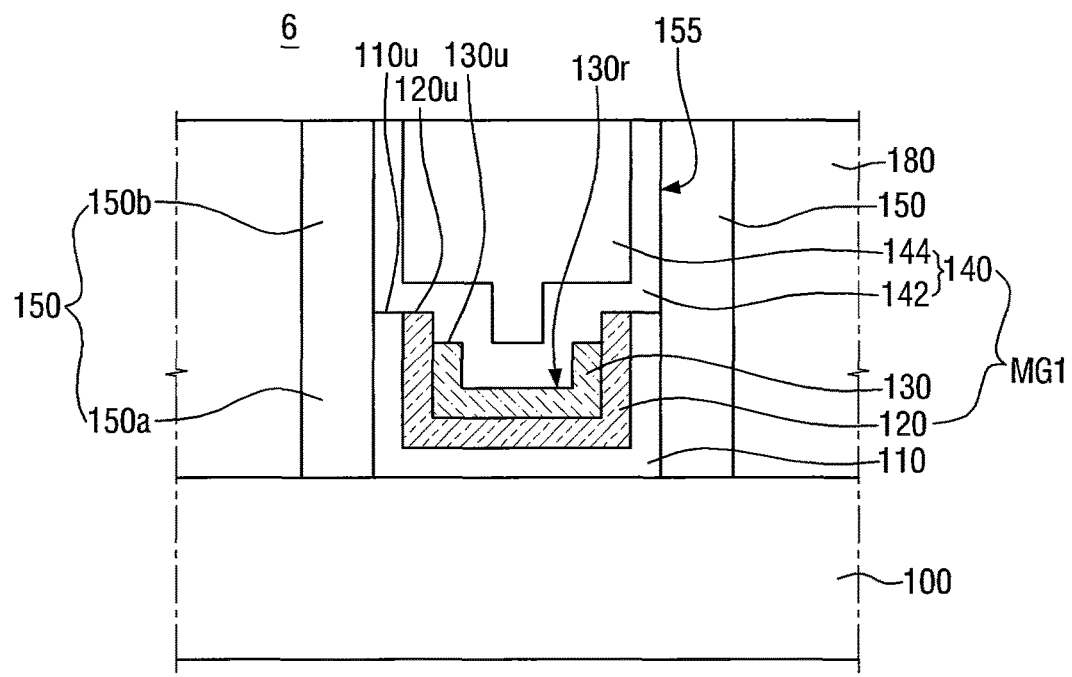
FIG. 6 is a diagram illustrating semiconductor devices according to a sixth embodiment of the present inventive concepts.

FIG. 6 is a diagram illustrating semiconductor devices according to a sixth embodiment of the present inventive concepts. For convenience of description, differences from the description of FIG. 5 will be mainly described.

Referring to FIG. 6, in semiconductor devices 6 according to the sixth embodiment of the present inventive concepts, the height from the bottom surface of the first trench 155 to the uppermost part 130u of the first lower conductive film can be lower than the height from the bottom surface of the first trench 155 to the uppermost part 120u of the first work function adjustment film.

The first lower conductive film 130 may not extend on or cover the uppermost part 120u of the first work function adjustment film. In addition, the first work function adjustment film 120 does not extend on or cover the uppermost part 130u of the first lower conductive film.

Figure 7:
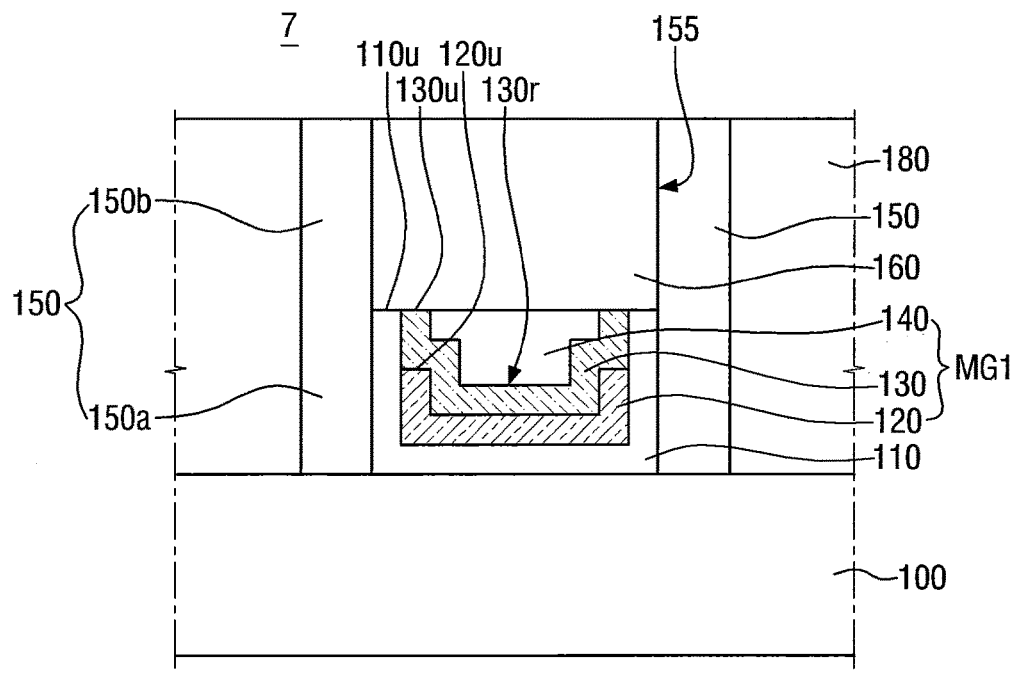
FIG. 7 is a diagram illustrating semiconductor devices according to a seventh embodiment of the present inventive concepts.

FIG. 7 is a diagram illustrating semiconductor devices according to a seventh embodiment of the present inventive concepts. For convenience of description, differences from the description of FIG. 1 will be mainly described.

Referring to FIG. 7, semiconductor devices 7 according to the seventh embodiment of the present inventive concepts can further include a first capping pattern 160.

The first gate electrode MG1 can fill a part of the first trench 155. More specifically, the first gate electrode MG1 can fill a part of the first trench 155 defined by the lower part 150a of the first gate spacer.

Since the first gate insulating film 110 is in contact with the lower part 150a of the first gate spacer but is not in contact with the upper part 150b of the first gate spacer, the first gate electrode MG1 and the first gate insulating film 110 can fill a part of the first trench 155 defined by the lower part 150a of the first gate spacer. That is, the portions of the first gate spacer 150 opposite the substrate 100 are free of the first gate insulating film 110, the first lower conductive film 130 and the first upper conductive film 140.

The first capping pattern 160 can be formed on the first gate electrode MG1 and the first gate insulating film 110. In other words, the first capping pattern 160 can be formed on the first lower conductive film 130 and the first upper conductive film 140. The first capping pattern 160 may directly formed on the portions of the first gate spacer 150 that are free of the first gate insulating film 110, the first lower conductive film 130 and the first upper conductive film 140.

The first capping pattern 160 can be formed by filling a part of the first trench 155. More specifically, the first capping pattern 160 can be formed by filling a part of the first trench 155 defined by the upper part 150b of the first gate spacer.

Since the first capping pattern 160 is formed by filling a part of the first trench 155 of the first gate electrode MG1, the upper surface of the first capping pattern 160 can be located on the same plane as or coplanar with the upper surface of the first gate spacer 150.

Since the first capping pattern 160 can serve as a guide for forming a self-aligned contact, it can contain a material having an etching selectivity to the interlayer insulating film 180. The first capping pattern 160 can include, for example, at least one of silicon nitride (SiN), silicon oxynitride (SiON), silicon oxide (SiO$_2$), silicon carbonitride (SiCN), silicon carbon oxynitride (SiOCN) and combinations thereof.

As illustrated, the first upper conductive film 140 can be formed by filling a first recess 130r that is defined along the profile of the first lower conductive film 130. However, the first upper conductive film 14Q may not protrude upward from the uppermost part 110u of the first gate insulating film and the uppermost part 130u of the first lower conductive film.

That is, the upper surface of the first upper conductive film 14Q can be placed on the same plane as or coplanar with the uppermost part 110u of the first gate insulating film and the uppermost part 130u of the first lower conductive film.

Figure 8:
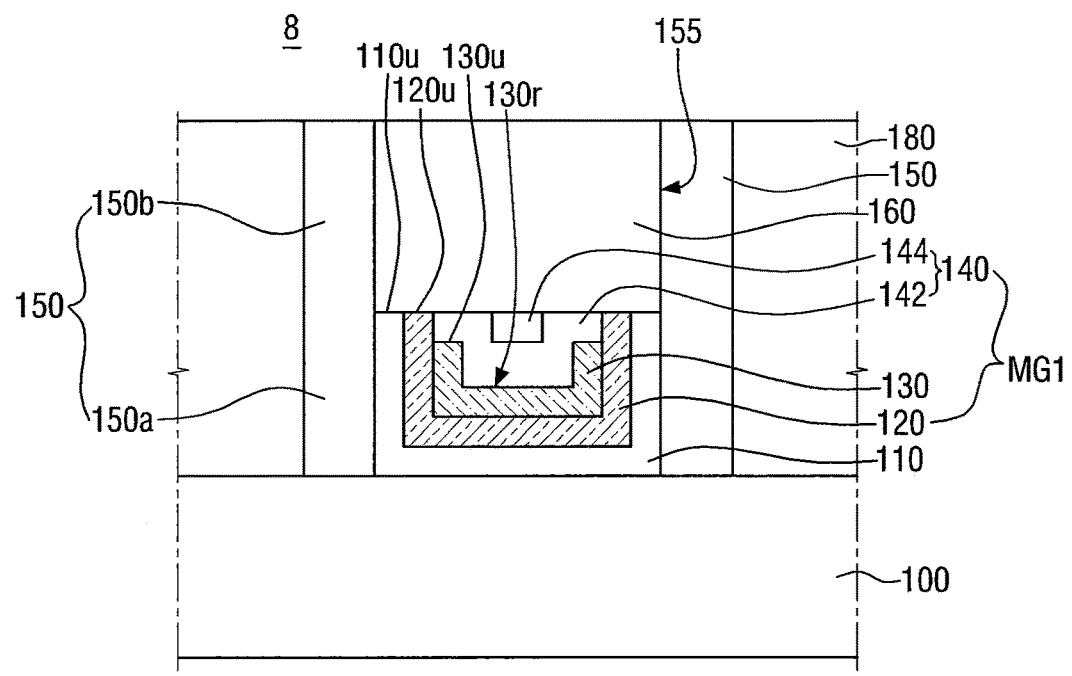
FIG. 8 is a diagram illustrating semiconductor devices according to an eighth embodiment of the present inventive concepts.

FIG. 8 is a diagram illustrating semiconductor devices according to an eighth embodiment of the present inventive concepts. For convenience of description, differences from the description of FIG. 7 will be mainly described.

Referring to FIG. 8, in semiconductor devices 8 according to the eighth embodiment of the present inventive concepts, the first upper conductive film 140 can include a lower filling film 142 and a first upper filling film 144 that are sequentially formed on the first lower conductive film 130.

Figure 9:
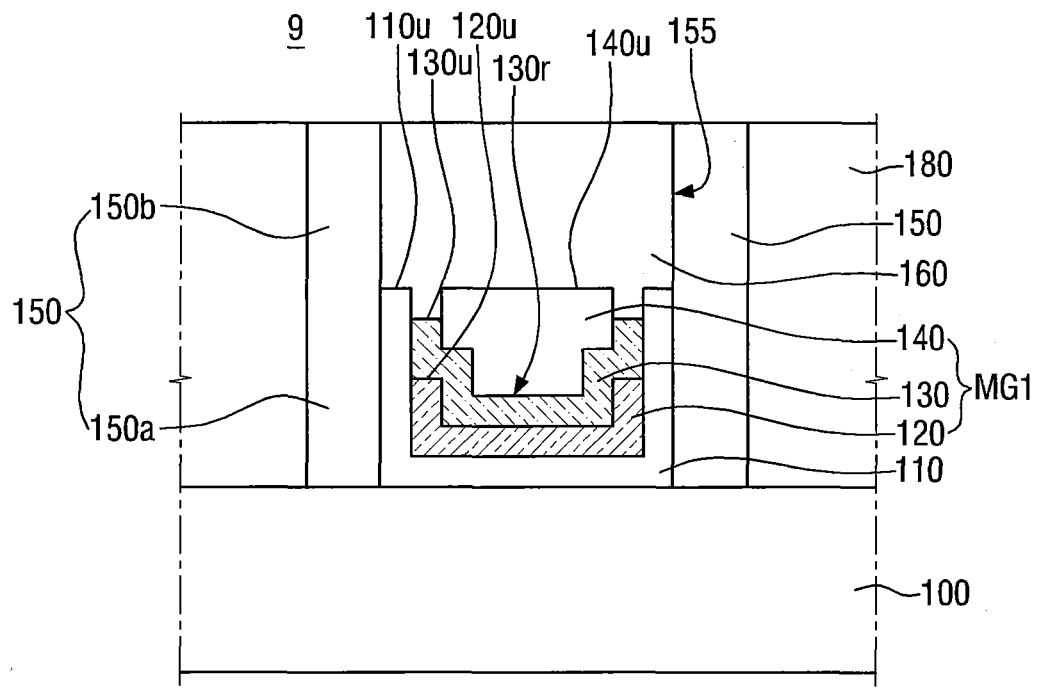
FIG. 9 is a diagram illustrating semiconductor devices according to a ninth embodiment of the present inventive concepts.
Figure 10:
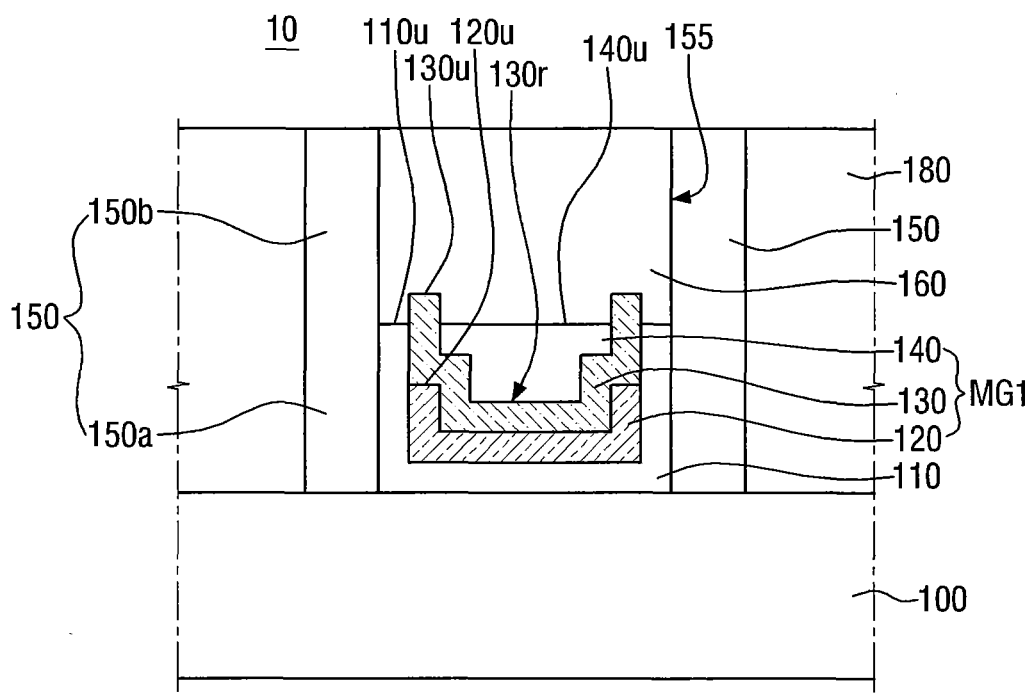
FIG. 10 is a diagram illustrating semiconductor devices according to a tenth embodiment of the present inventive concepts.

FIG. 9 is a diagram illustrating semiconductor devices according to a ninth embodiment of the present inventive concepts. FIG. 10 is a diagram illustrating semiconductor devices according to a tenth embodiment of the present inventive concepts. For convenience of description, differences from the description of FIG. 7 will be mainly described.

Referring to FIG. 9, in semiconductor devices 9 according to the ninth embodiment of the present inventive concepts, the height from the bottom surface of the first trench 155 to the uppermost part 110u of the first gate insulating film can be higher than the height from the bottom surface of the first trench 155 to the uppermost part 130u of the first lower conductive film.

Also, the height from the bottom surface of the first trench 155 to the uppermost part 140u of the first upper conductive film can be higher than the height from the bottom surface of the first trench 155 to the uppermost part 130u of the first lower conductive film.

That is, on the basis of the bottom surface of the first trench 155, the uppermost part 130u of the first lower conductive film can be lower than the uppermost part 140u of the first upper conductive film and the uppermost part 110u of the first gate insulating film.

Thus, a part of the first capping pattern 160 can be inserted between the first gate insulating film 110 and the first upper conductive film 140. A part of the first capping pattern 160 can be interposed between the first gate insulating film 110 and the first upper conductive film 140.

Referring to FIG. 10, in semiconductor devices 10 according to a tenth embodiment of the present inventive concepts, the height from the bottom surface of the first trench 155 to the uppermost part 110u of the first gate insulating film can be lower than the height from the bottom surface of the first trench 155 to the uppermost part 130u of the first lower conductive film.

Also, the height from the bottom surface of the first trench 155 to the uppermost part 140u of the first upper conductive film can be lower than the height from the bottom surface of the first trench 155 to the uppermost part 130u of the first lower conductive film.

That is, on the basis of the bottom surface of the first trench 155, the uppermost part 130u of the first lower conductive film can be higher than the uppermost part 140u of the first upper conductive film and the uppermost part 110u of the first gate insulating film. A part of the first lower conductive film 130 can protrude upward from the uppermost part 110u of the first gate insulating film and the uppermost part 140u of the first upper conductive film.

Thus, a part of the first capping pattern 160 can fill a part of the first recess 130r defined by the first lower conductive film 130. The first upper conductive film 140 can fill the lower part of the first recess 130r, and the first capping pattern 160 can fill the upper part of the first recess 130r.

In other words, a part of the first lower conductive film 130 protruding upward from the uppermost part 110u of the first gate insulating film and the uppermost part 140u of the first upper conductive film can be inserted or can otherwise extend into the first capping pattern 160.

Figure 11:
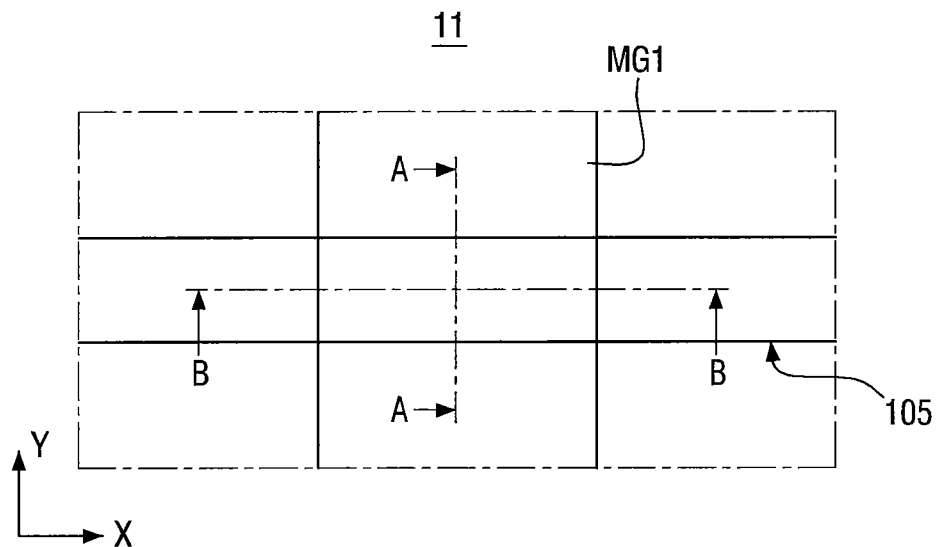
FIG. 11 is a layout diagram illustrating semiconductor devices according to an eleventh embodiment of the present inventive concepts.
Figure 12:
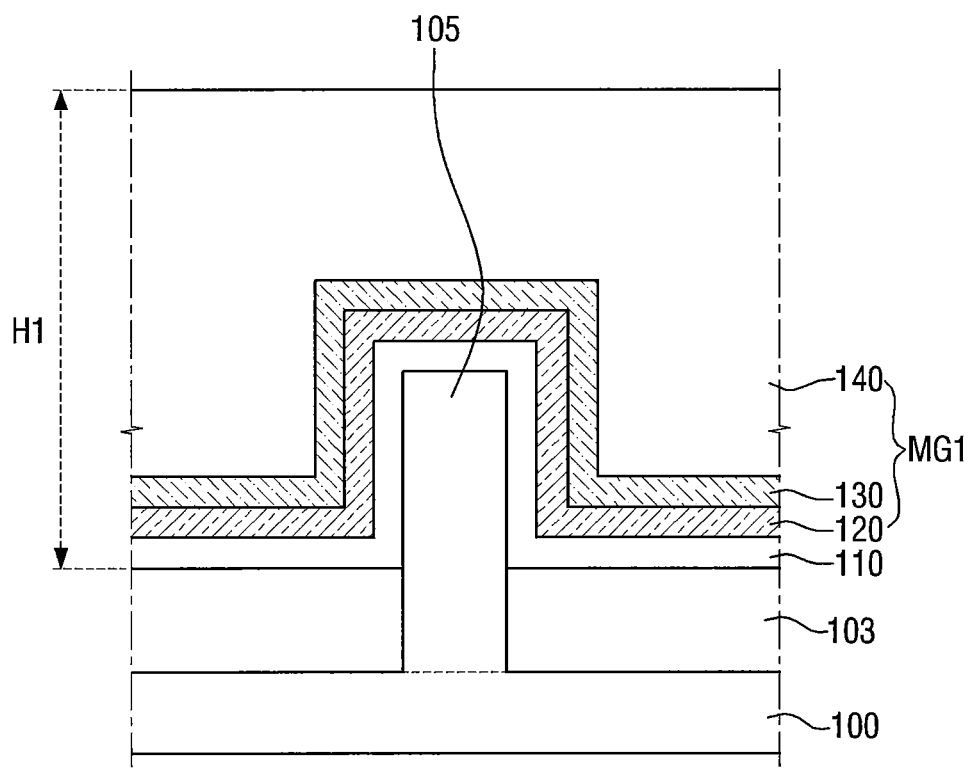
FIG. 12 is a cross-sectional view taken along a line A-A of FIG. 11.
Figure 13:
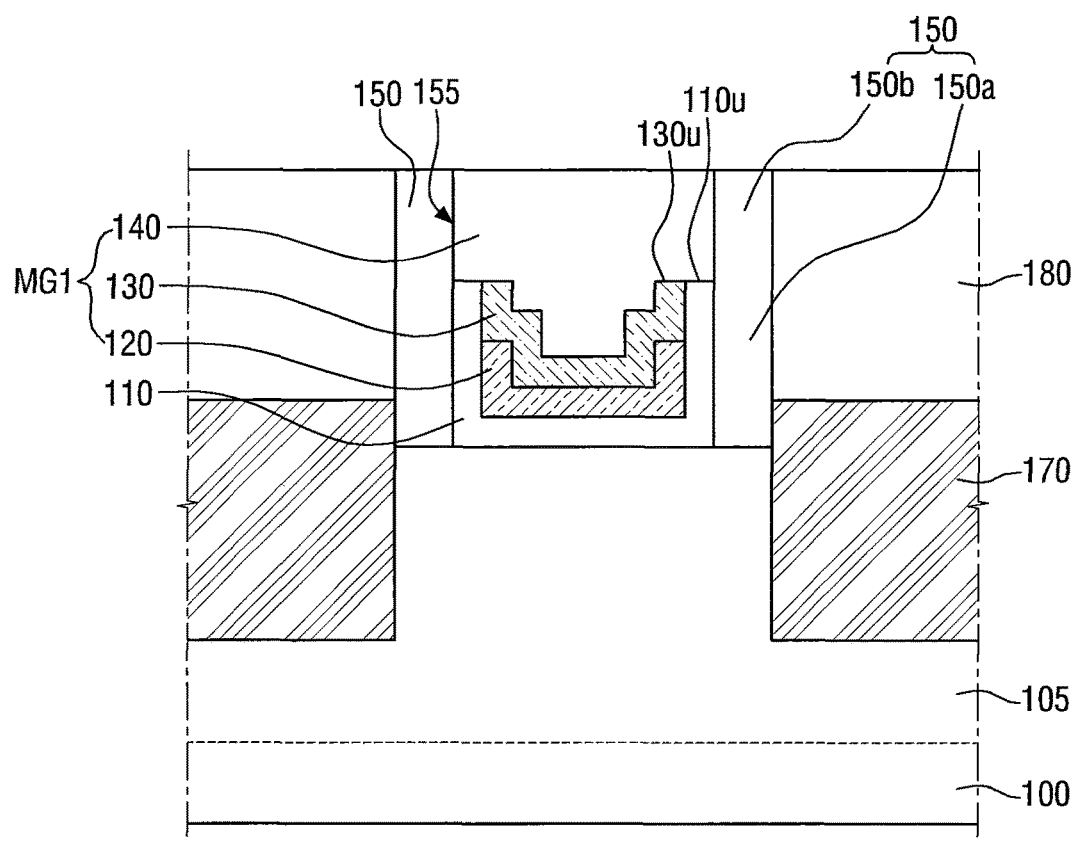
FIG. 13 is a cross-sectional view taken along a line B-B of FIG. 11.

FIG. 11 is a layout diagram illustrating semiconductor devices according to an eleventh embodiment of the present inventive concepts. FIG. 12 is a cross-sectional view taken along a line A-A of FIG. 11. FIG. 13 is a cross-sectional view taken along a line B-B of FIG. 11. For convenience of description, differences from the description of FIG. 1 will be mainly described.

Embodiments described through FIGS. 11 to 13 illustrate a case in which the semiconductor device illustrated in FIG. 1 is a fin type transistor. The eleventh embodiment of the present inventive concepts will be illustratively described with reference to the semiconductor device described in FIG. 1, but it will be understood that the semiconductor devices described through FIGS. 3 to 10 can also be embodied as a fin type transistor.

Referring to FIGS. 11 to 13, the semiconductor device 11 according to the eleventh embodiment of the present inventive concepts can include a fin type pattern 105, a first gate electrode MG1, a first gate spacer 150, a first gate insulating film 110 and the like.

The fin type pattern 105 may protrude from the substrate 100. Since the field insulating film 103 extends on or covers a part of the side surface of the fin type pattern 105, the fin type pattern 105 may protrude upward from the field insulating film 103 formed on substrate 100

The fin type pattern 105 can be extended long along a first direction X. The fin type pattern 105 may be a part of the substrate 100 and may include an epitaxial layer grown from the substrate 100.

The fin type pattern 105 can contain, for example, silicon and/or germanium as an element semiconductor material. Moreover, the fin type pattern 105 can include a compound semiconductor and can include, for example, a group IV-IV compound semiconductor or a group III-V compound semiconductor.

Specifically, when taking the group IV-IV compound semiconductor as an example, the fin type pattern 105 can be a binary compound or a ternary compound containing at least two or more of carbon (C), silicon (Si), germanium (Ge) and tin (Sn) or a compound in which these elements are doped with a group IV element.

When taking the group III-V compound semiconductor as an example, the fin type pattern 105 can be a binary compound, a ternary compound or a quaternary compound formed by combination of at least one of aluminum (Al) gallium (Ga) and indium (In) as the group III elements with at least one of phosphorus (P), arsenic (As) and antimonium (Sb) as the group V elements.

In the semiconductor device according to the eleventh embodiment of the present inventive concepts, the fin type pattern 105 will be described as containing silicon.

The first gate spacer 150 can be formed on the fin type pattern 105 that protrudes above the field insulating film 103. The first gate spacer 150 can be extended long along a second direction Y and can intersect with the fin type pattern 105.

Since the first gate spacer 150 is entirely formed on the sidewalls of the first gate electrode MG1, a height H1 of the first gate spacer 150 can be a height from the upper surface of the field insulating film 103 to the uppermost part of the first gate electrode MG1.

Since the first trench 155 is defined by the first gate spacer 150, the first trench 155 can be extended long along the second direction Y.

The first gate insulating film 110 can be formed along a part of the sidewalls and the bottom surface of the first trench 155. The first gate insulating film 110 is in contact with the lower part 150a of the first gate spacer, but it may not be in contact with the upper part 150b of the first gate spacer.

The first gate insulating film 110 formed along the bottom surface of the first trench 155 can be formed along the profiles of the field insulating film 103 and the fin type pattern 105.

In the semiconductor device 11 according to the eleventh embodiment of the present inventive concepts, the height from the upper surface of the field insulating film 103 to the uppermost part 110u of the first gate insulating film can be larger than the height from the upper surface of the field insulating film 103 to the uppermost part of the fin type pattern 105. However, the height from the upper surface of the field insulating film 103 to the uppermost part 110u of the first gate insulating film can be lower than the height H1 of the first gate spacer 150.

The first work function adjustment film 120 can be formed on the first gate insulating film 110 formed along the profiles of the field insulating film 103 and the fin type pattern 105.

The first work function adjustment film 120 can be formed along a part of the sidewalls of the first trench 155 and the bottom surface of the first trench 155. The first work function adjustment film 120 can be formed along the profile of the first gate insulating film 110.

The first lower conductive film 130 can be formed on the first work function adjustment film 120 which is formed along the profiles of the field insulating film 103 and the fin type pattern 105. The first lower conductive film 130 can be formed along a part of the sidewalls of the first trench 155 and the bottom surface of the first trench 155.

The first lower conductive film 130 can be formed along the profile of the first work function adjustment film 120.

The first upper conductive film 140 can be formed on the first lower conductive film 130 which is formed along the profiles of the field insulating film 103 and the fin type pattern 105.

The first upper conductive film 140 can fill the remainder of the first trench 155 that is left after the first gate insulating film 110, the first work function adjustment film 120 and the first lower conductive film 130 are formed.

Elevated source/drains 170 can be formed on the fin type pattern 105, on both sides of the first gate electrode MG1. That is, the elevated source/drains 170 can be formed on both sides of the first gate spacer 150.

Figure 14:
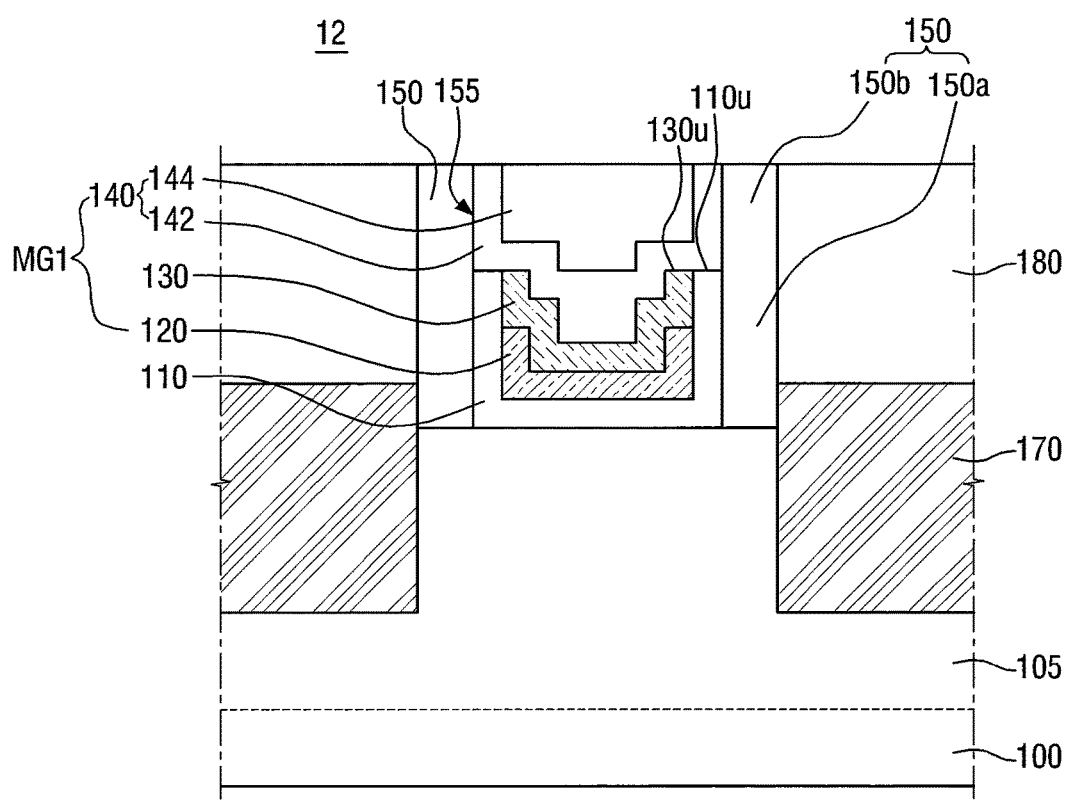
FIG. 14 is a diagram illustrating semiconductor devices according to a twelfth embodiment of the present inventive concepts.

FIG. 14 is a diagram illustrating semiconductor devices according to a twelfth embodiment of the present inventive concepts. For convenience of description, differences from the descriptions of FIGS. 11 to 13 will be mainly described.

Referring to FIG. 14, in semiconductor devices 12 according to the twelfth embodiment of the present inventive concepts, the first upper conductive film 140 can include a first lower filling film 142 and a first upper filling film 144.

The first lower filling film 142 can be formed along the profile of the upper part 150b of the first gate spacer and the profile of the first lower conductive film 130. Moreover, the first lower filling film 142 can be formed on the first lower conductive film 130 which is formed along the profiles of the field insulating film 103 and the fin type pattern 105.

The first upper filling film 144 can be formed on the first lower filling film 142. The first upper filling film 144 can be formed so as to fill the remainder of the first trench 155 that is left after the first lower filling film 142 is formed.

Figure 15:
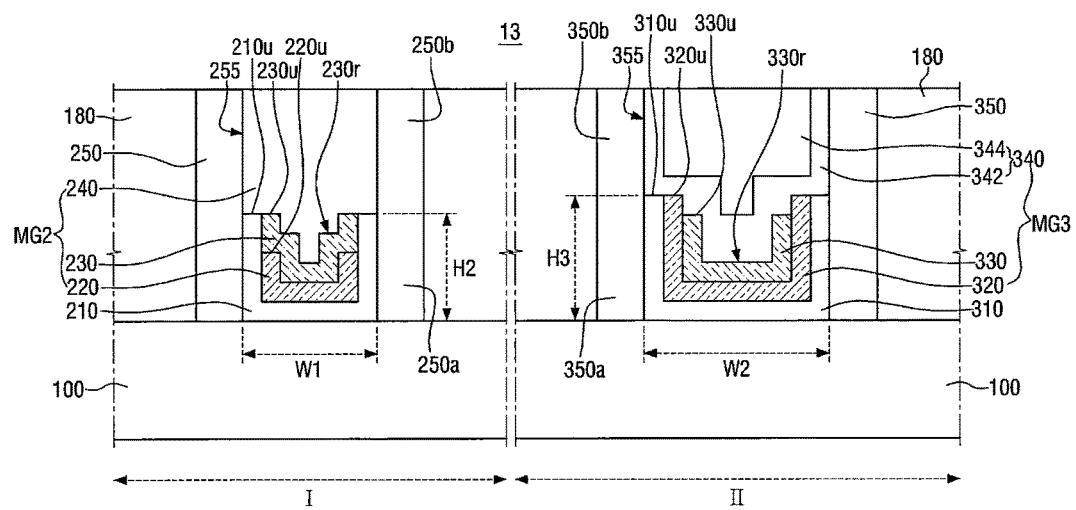
FIG. 15 is a diagram illustrating semiconductor devices according to a thirteenth embodiment of the present inventive concepts.

FIG. 15 is a diagram illustrating semiconductor devices according to a thirteenth embodiment of the present inventive concepts.

Referring to FIG. 15, semiconductor devices 13 according to the thirteenth embodiment of the present inventive concepts can include a second gate spacer 250, a second trench 255, a second gate insulating film 210, a second gate electrode MG2, a third gate spacer 350, a third trench 355, a third gate insulating film 310, a third gate electrode MG3 and the like.

The substrate 100 can include a first region I and a second region II. The first region I and the second region II may be spaced apart from each other and may be connected to each other.

Further, both the first region I and the second region II may be a region in which the NMOS is formed, or may be a region in which the PMOS is formed.

In the semiconductor device according to the thirteenth embodiment of the present inventive concepts, the first region I can be a region in which a transistor having a short channel is formed, and the second region II can be a region in which a transistor having a long channel is formed.

The second gate spacer 250 can be formed on the first region I of the substrate 100. The second gate spacer 250 can include an upper part 250b and a lower part 250a. The third gate spacer 350 can be formed on the second region II of the substrate 100. The third gate spacer 350 can include an upper part 350b and a lower part 350a.

The second trench 255 can be defined by the second gate spacer 25Q. The third trench 355 can be defined by the third gate spacer 350.

A width of the second trench 255 can be a first width W1 and a width of the third trench 355 can be a second width W2. In the semiconductor device 13 according to the thirteenth embodiment of the present inventive concepts, the width W2 of the third trench 355 can be larger than the width W1 of the second trench 255.

The second gate insulating film 210 can be formed along a part of the sidewalls and the bottom surface of the second trench 255. The second gate insulating film 210 is in contact with the lower part 250a of the second gate spacer but may not be in contact with the upper part 250b of the second gate spacer.

The third gate insulating film 310 can be formed along a part of the sidewalls and the bottom surface of the third trench 355. The third gate insulating film 310 is in contact with the lower part 350a of the third gate spacer but may not be in contact with the upper part 350b of the third gate spacer.

In the semiconductor device according to the thirteenth embodiment of the present inventive concepts, a height H2 from the bottom surface of the second trench 255 to the uppermost part 210u of the second gate insulating film can be different from a height H3 from the bottom surface of the third trench 355 to the uppermost part 310u of the third gate insulating film.

In FIG. 15, although the height H3 from the bottom surface of the third trench 355 to the uppermost part 310u of the third gate insulating film is illustrated as being higher than the height H2 from the bottom surface of the second trench 255 to the uppermost part 210u of the second gate insulating film, this is only an example for description and is not limited thereto.

The second gate electrode MG2 can be formed on the second gate insulating film 210. The second gate electrode MG2 can fill at least a part of the second trench 255. The second gate electrode MG2 can include a second work function adjustment film 220, a second lower conductive film 230 and a second upper conductive film 240.

The third gate electrode MG3 can be formed on the third gate insulating film 310. The third gate electrode MG3 can fill at least a part of the third trench 355. The third gate electrode MG3 can include a third work function adjustment film 320, a third lower conductive film 330 and a third upper conductive film 340.

In the semiconductor device 13 according to the thirteenth embodiment of the present inventive concepts, the second gate electrode MG2 can entirely fill the second trench 255, and the third gate electrode MG3 can entirely fill the third trench 355.

The second work function adjustment film 220 can be formed on the second gate insulating film 210. The second work function adjustment film 220 can be formed along a part of the sidewalls of the second trench 255 and the bottom surface of the second trench 255. The second work function adjustment film 220 can be formed along the profile of the second gate insulating film 210.

The third work function adjustment film 320 can be formed on the third gate insulating film 31Q. The third work function adjustment film 320 can be formed along a part of the sidewalls of the third trench 355 and the bottom surface of the third trench 355. The third work function adjustment film 320 can be formed along the profile of the third gate insulating film 310.

In the semiconductor device according to the thirteenth embodiment of the present inventive concepts, the height from the bottom surface of the second trench 255 to the uppermost part 210u of the second gate insulating film can be higher than the height from the bottom surface of the second trench 255 to the uppermost part 220u of the second work function adjustment film.

Further, in the semiconductor device according to the thirteenth embodiment of the present inventive concepts, the height of the bottom surface of the third trench 355 to the uppermost part 310u of the third gate insulating film can be substantially equal to the height from the bottom surface of the third trench 355 to the uppermost part 320u of the third work function adjustment film.

The second work function adjustment film 220 and the third work function adjustment film 320 can contain, for example, at least one of TiN, TaN, and combinations thereof. The thicknesses and/or laminated structures of materials of the second work function adjustment film 220 and the third work function adjustment film 320 may be the same or may be different from each other.

The second lower conductive film 230 can be formed on the second work function adjustment film 220. The second lower conductive film 230 can be formed along a part of the sidewalls of the second trench 255 and the bottom surface of the second trench 255. The second work function adjustment film 220 can be formed between the second lower conductive film 230 and the second gate insulating film 210.

The third lower conductive film 330 can be formed on the third work function adjustment film 320. The third lower conductive film 330 can be formed along a part of the sidewalls of the third trench 355 and the bottom surface of the second trench 355. The third work function adjustment film 320 can be formed between the third lower conductive film 330 and the third gate insulating film 310.

In the semiconductor device according to the thirteenth embodiment of the present inventive concepts, the second lower conductive film 230 can extend on or cover the uppermost part 220u of the second work function adjustment film. The height from the bottom surface of the second trench 255 to the uppermost part 230u of the second lower conductive film can be higher than the height from the bottom surface of the second trench 255 to the uppermost part 220u of the second work function adjustment film.

In addition, the height from the bottom surface of the second trench 255 to the uppermost part 230u of the second lower conductive film can be substantially equal to the height from the bottom surface of the second trench 255 to the uppermost part 210u of the second gate insulating film. In other words, the second lower conductive film 230 may not be overlapped with the upper part 250b of the second gate spacer.

Meanwhile, the height from the bottom surface of the third trench 355 to the uppermost part 330u of the third lower conductive film can be lower than the height from the bottom surface of the third trench 355 to the uppermost part 320u of the third work function adjustment film. The third lower conductive film 330 may not extend on or cover the uppermost part 320u of the third work function adjustment film.

The second lower conductive film 230 and the third lower conductive film 330 can contain the same material and can contain, for example, TiAlC.

The second upper conductive film 240 can be formed on the second lower conductive film 230. The second upper conductive film 240 can fill the second trench 255. The second upper conductive film 240 can fill the remainder of the second trench 255 that is left after the second gate insulating film 210, the second work function adjustment film 220 and the second lower conductive film 230 are formed.

The second upper conductive film 240 can extend on or cover the uppermost part 210u of the second gate insulating film and the uppermost part 230u of the second lower conductive film. The second upper conductive film 240 can serve as a filling film.

The third upper conductive film 340 can be formed on the third lower conductive film 330. The third upper conductive film 340 can fill the third trench 355. The third upper conductive film 340 can fill the remainder of the third trench 355 that is left after the third gate insulating film 310, the third work function adjustment film 320 and the third lower conductive film 330 are formed.

The third upper conductive film 340 can include a third lower filling film 342 and a third upper filling film 344 which are sequentially formed on the third lower conductive film 330.

The third lower filling film 342 can be formed along the profile of the upper part 350b of the third gate spacer and the profile of the third lower conductive film 330. The third lower filling film 342 can extend on or cover the uppermost part 310u of the third gate insulating film and the uppermost part 330u of the third lower conductive film.

The third upper filling film 344 can be formed on the third lower filling film 342. The third upper filling film 344 can be formed so as to fill the remainder of the third trench 355 that is left after the third lower filling film 342 is formed.

The second upper conductive film 240 and the third lower filling film 344 can contain the same material and can contain, for example, TiN.

The third upper filling film 344 can serves as a filling film that fills the third trench 355 and contain, for example, tungsten (W), aluminum (Al), cobalt (Co) or the like, but is not limited thereto.

Figure 16:
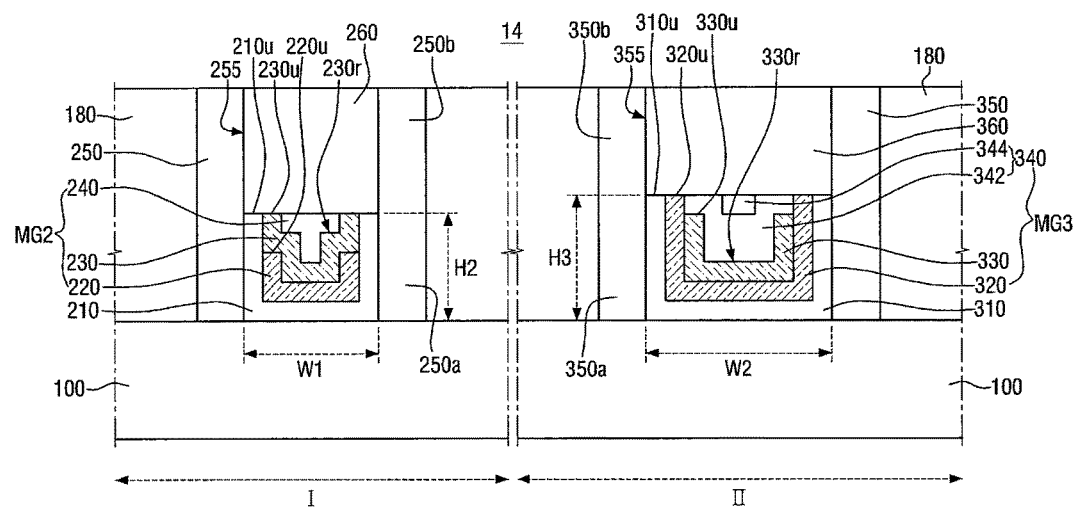
FIG. 16 is a diagram illustrating semiconductor devices according to a fourteenth embodiment of the present inventive concepts.

FIG. 16 is a diagram illustrating semiconductor devices according to a fourteenth embodiment of the present inventive concepts. For convenience of description, differences from the description of FIG. 15 will be mainly described.

Referring to FIG. 16, semiconductor devices 16 according to the fourteenth embodiment of the present inventive concepts can further include a second capping pattern 260 and a third capping pattern 360.

The second gate electrode MG2 can fill a part of the second trench 255. The second gate electrode MG2 can fill a part of the second trench 255 that is defined by the lower part 250a of the second gate spacer.

Since the second gate insulating film 210 is in contact with the lower part 250a of the second gate spacer but is not in contact with the upper part 250b of the second gate spacer, the second gate electrode MG2 and the second gate insulating film 210 can fill a part of the second trench 255 that is defined by the lower part 250a of the second gate spacer.

The second capping pattern 260 can be formed on the second gate electrode MG2 and the second gate insulating film 210. The second capping pattern 260 can be formed by filling a part of the second trench 255. More specifically, the second capping pattern 260 can be formed by filling a part of the second trench 255 that is defined by the upper part 250b of the second gate spacer.

The third gate electrode MG3 can fill a part of the third trench 355. Since the third gate insulating film 310 is in contact with the lower part 350a of the third gate spacer but is not in contact with the upper part 350b of the third gate spacer, the third gate electrode MG3 and the third gate insulating film 310 can fill a part of the third trench 355 that is defined by the lower part 350a of the third gate spacer.

The third capping pattern 360 can be formed on the third gate electrode MG3 and the third gate insulating film 310. The third capping pattern 360 can be formed by filling a part of the third trench 355. More specifically, the third capping pattern 360 can be formed by filling a part of the third trench 355 that is defined by the upper part 350b of the third gate spacer.

Figure 17:
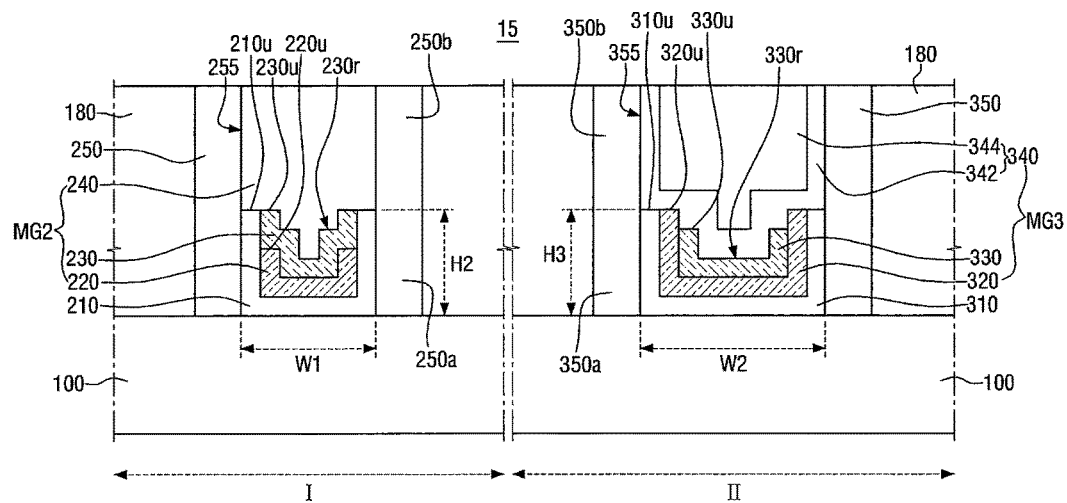
FIG. 17 is a diagram illustrating semiconductor devices according to a fifteenth embodiment of the present inventive concepts.

FIG. 17 is a diagram illustrating semiconductor devices according to a fifteenth embodiment of the present inventive concepts. For convenience of description, differences from the description of FIG. 15 will be mainly described.

Referring to FIG. 17, in semiconductor devices 15 according to the fifteenth embodiment of the present inventive concepts, a height H2 from the bottom surface of the second trench 255 to the uppermost part 210u of the second gate insulating film can be substantially equal to a height H3 from the bottom surface of the third trench 355 to the uppermost part 310u of the third gate insulating film.

Figure 18:
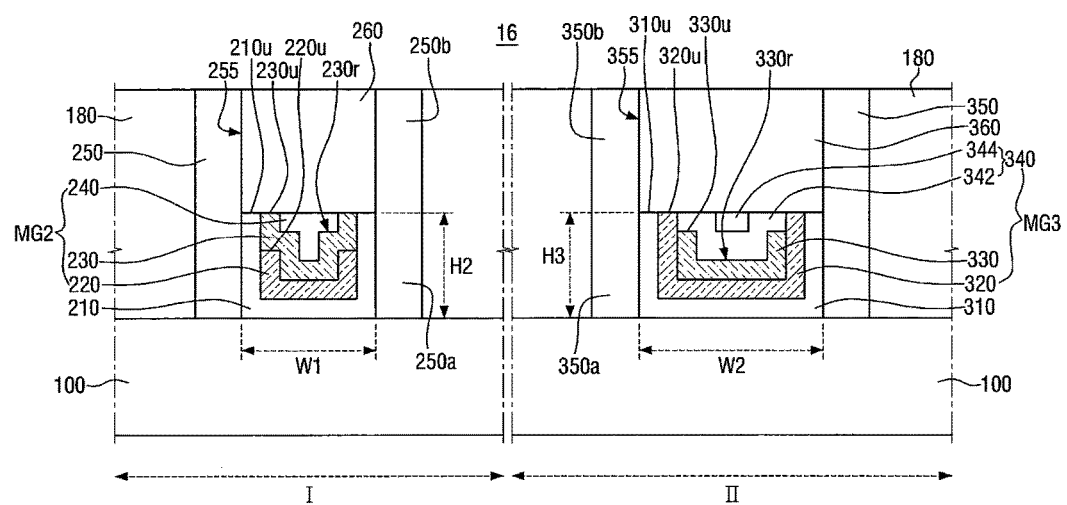
FIG. 18 is a diagram illustrating semiconductor devices according to a sixteenth embodiment of the present inventive concepts.

FIG. 18 is a diagram illustrating semiconductor devices according to a sixteenth embodiment of the present inventive concepts. For convenience of description, differences from the description of FIG. 17 will be mainly described.

Referring to FIG. 18, semiconductor devices 16 according to the sixteenth embodiment of the present inventive concepts can further include a second capping pattern 260 and a third capping pattern 360.

The second gate electrode MG2 can fill a part of the second trench 255. Thus, the second capping pattern 260 can be formed on the second gate electrode MG2 to fill the remainder of the second trench 255.

The third gate electrode MG3 can fill a part of the third trench 355. Therefore, the third capping pattern 36Q can be formed on the third gate electrode MG3 to fill the remainder of the third trench 355.

FIGS. 19 to 29 are intermediate stage diagrams illustrating methods for fabricating semiconductor devices according to some embodiments of the present inventive concepts. The semiconductor device according to the fifteenth embodiment of the present inventive concepts can be fabricated through this method.

FIGS. 19 to 29 illustrate processes in which the semiconductor devices are manufactured in different regions. However, it will be understood to those skilled in the art that FIGS. 19 to 29 can be understood as the processes for fabricating the semiconductor device, by separating each region of the different regions.

Figure 19:
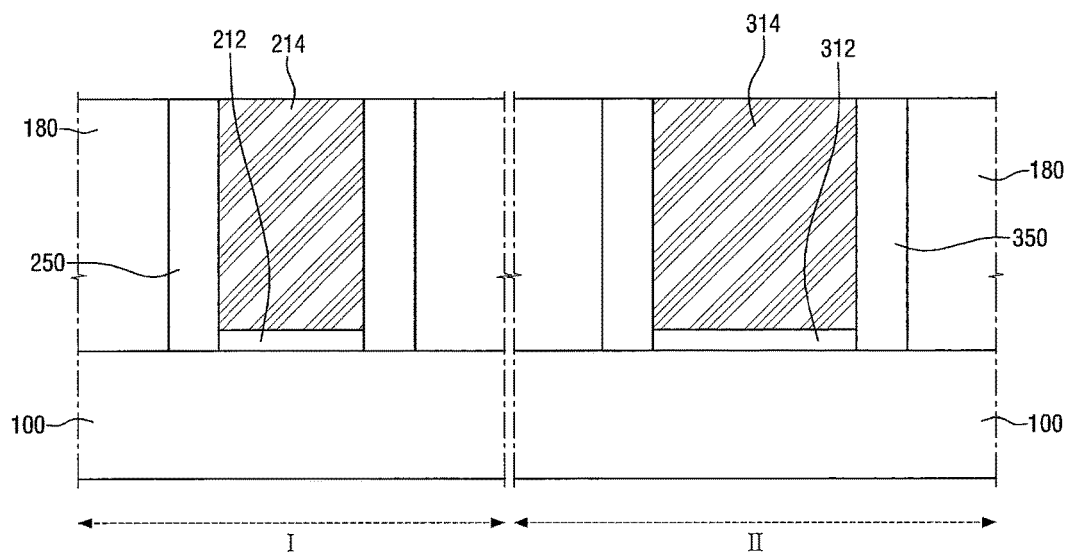
FIGS. 19 to 29 are intermediate phase diagrams illustrating methods for fabricating semiconductor devices according to some embodiments of the present inventive concepts.

Referring to FIG. 19, a first dummy gate insulating film 212 and a first dummy gate electrode 214 that are sequentially laminated on the first upper region I of the substrate 100 may be formed. Also, a second dummy gate insulating film 312 and a second dummy gate electrode 314 that are sequentially laminated on the second region II of the substrate 100 may be formed.

The first dummy gate insulating film 212 and the second dummy gate insulating film 312 can contain silicon oxide, silicon oxynitride and combinations thereof. Each of the first dummy gate electrode 214 and the second dummy gate electrode 314 can be, for example, silicon, and specifically can contain one of polycrystalline silicon (poly Si), amorphous silicon (a-Si) and combinations thereof. The first dummy gate electrode 214 and the second dummy gate electrode 314 may not be doped with impurities or may be doped with impurities.

Subsequently, a second gate spacer 250 can be formed on the sidewalls of the first dummy gate electrode 214 and a third gate spacer 350 can be formed on the sidewalls of the second dummy gate electrode 314.

After forming each of the second gate spacer 250 and the third gate spacer 350, source/drain regions may be formed on both sides of the first dummy gate electrode 214 and on both sides of the second dummy gate electrode 314, respectively.

Subsequently, an interlayer insulating film 180 that extends on or covers the first dummy gate electrode 214 and the second dummy gate electrode 314 may be formed on the substrate 100.

Subsequently, the interlayer insulating film 180 is flattened so that the upper surface of the first dummy gate electrode 214, the upper surface of the second dummy gate electrode 314, the second gate spacer 250 and the third gate spacers 350 can be exposed.

Figure 20:
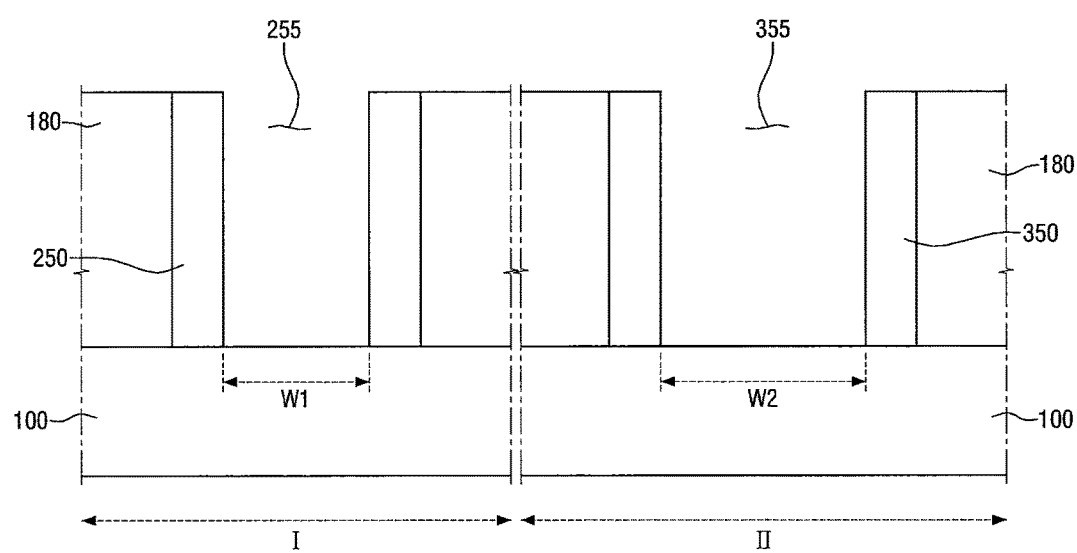

Referring to FIG. 20, the first dummy gate electrode 214 and the second dummy gate electrode 314 may be removed. After removing the first dummy gate electrode 214 and the second dummy gate electrode 314, by removing the first dummy gate insulating film 212 and the second dummy gate insulating film 312, a second trench 255 and a third trench 355 can be formed. The upper surface of the substrate 100 can be exposed by the second trench 255 and the third trench 355.

The interlayer insulating film 180 can include the second trench 255 defined by the second gate spacer 250, and the third trench 355 defined by the third gate spacer 350.

In the semiconductor device according to some embodiments of the present inventive concepts, the width W2 of the third trench 355 can be larger than the width W1 of the second trench 255.

The first dummy gate electrode 214 and the second dummy gate electrode 314 can be removed using a wet process or a dry process. Specifically, in the wet etching, it is possible to substantially remove the first dummy gate electrode 214 and the second dummy gate electrode 314, by exposing the electrodes to aqueous solution containing a hydroxide source at a sufficient temperature for a sufficient time. The hydroxide source can contain ammonium hydroxide or tetraalkyl ammonium hydroxide, for example, tetramethyl ammonium hydroxide (TMAH), but is not limited thereto.

The first dummy gate insulating film 212 and the second dummy gate insulating film 312 can be removed by the wet etching, the dry etching and combinations thereof. It will be understood that the etching solution or the etching gas may vary, depending on the materials of the first dummy gate insulating film 212 and the second dummy gate insulating film 312.

Figure 21:
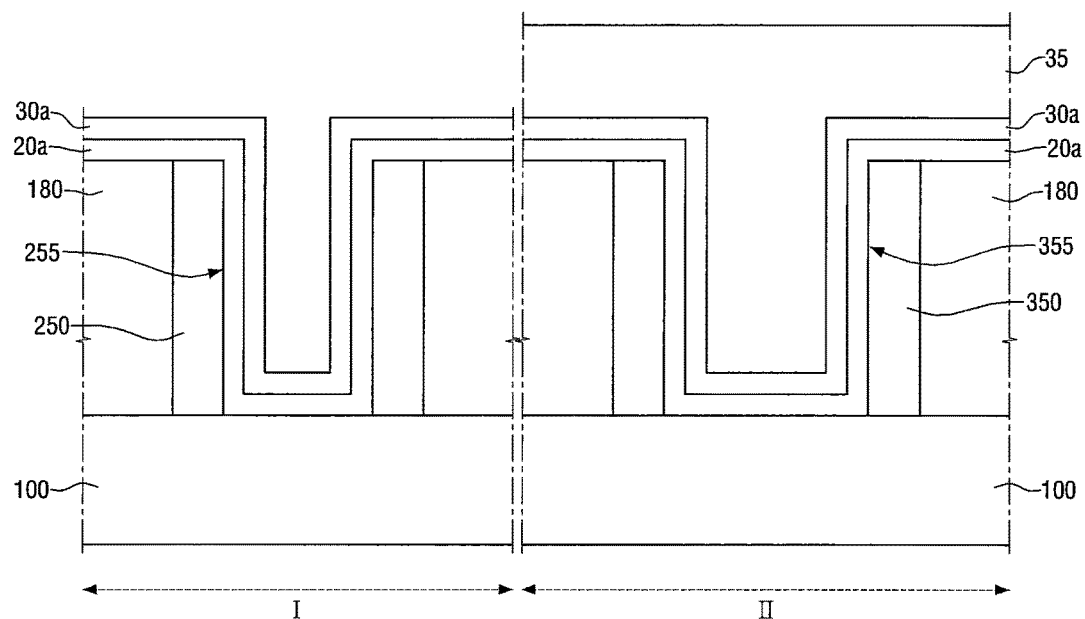

Referring to FIG. 21, a pre gate insulating film 20a may be formed along the sidewalls and the bottom surface of the second trench 255, and the sidewalls and the bottom surface of the third trench 355.

The pre gate insulating film 20a can also be formed on the upper surface of the interlayer insulating film 180. The pre gate insulating film 20a can include a high dielectric constant dielectric film.

In addition, before forming the pre gate insulating film 20a, an interfacial film may be formed along the bottom surface of the second trench 255 and the bottom surface of the third trench 355.

Subsequently, a pre work function adjustment film 30a can be formed on the pre gate insulating film 20a, along the sidewalls and the bottom surface of the second trench 255 and the sidewalls and the bottom surface of the third trench 355.

The pre work function adjustment film 30a can also be formed on the upper surface of the interlayer insulating film 18Q. The pre work function adjustment film 30a can contain, for example, at least one of TiN, TaN and the combinations thereof.

Subsequently, a first mask pattern 35 can be formed on the second region II of the substrate 100. The first mask pattern 35 can extend on or cover the pre work function adjustment film 30a which is formed on the second region II of the substrate 100. Also, the pre work function adjustment film 30a formed in the first region I of the substrate 100 can be exposed by the first mask pattern 35.

Figure 22:
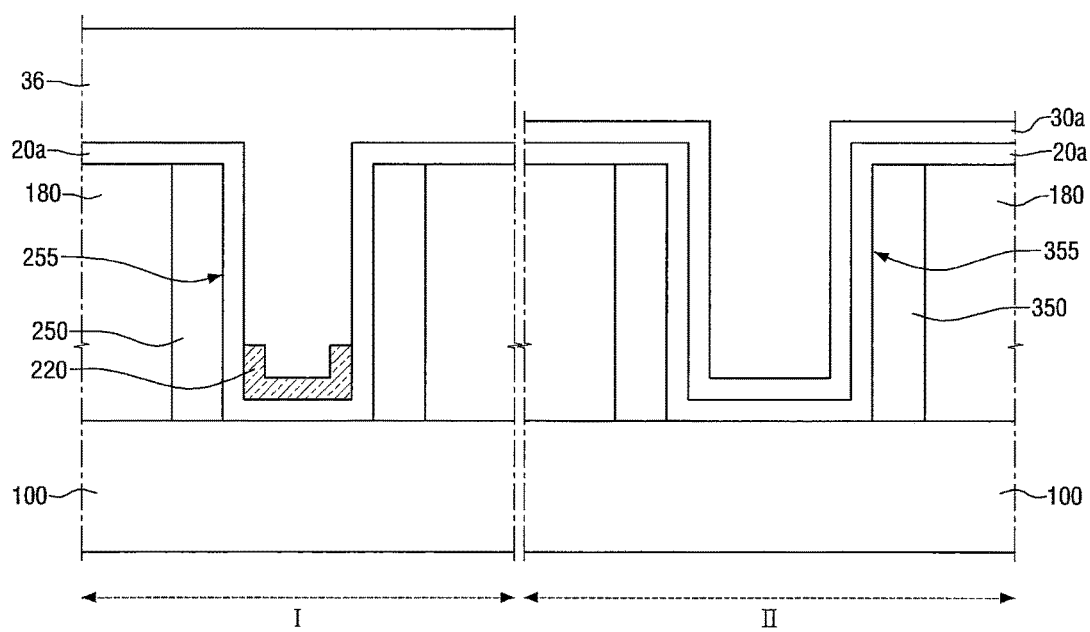

Referring to FIG. 22, a second work function adjustment or controlling film 220 can be formed, by chamfering the pre work function adjustment film 30a formed in the first region I of the substrate 100, using the first mask pattern 35.

The second work function adjustment film 220 formed in the first region I of the substrate 100 can be formed on the pre gate insulating film 20a. The second work function adjustment film 220 can be formed along a part of the sidewalls and the bottom surface of the second trench 255.

Subsequently, the pre work function adjustment film 30a formed in the second region II of the substrate 100 may be exposed by removing the first mask pattern 35. Further, a second mask pattern 36 can be formed on the first region I of the substrate 100.

The second mask pattern 36 can extend on or cover the second work function adjustment film 220 formed on the first region I of the substrate 100. Also, the pre work function adjustment film 30a formed in the second region II of the substrate 100 can be exposed by the second mask pattern 36.

Figure 23:
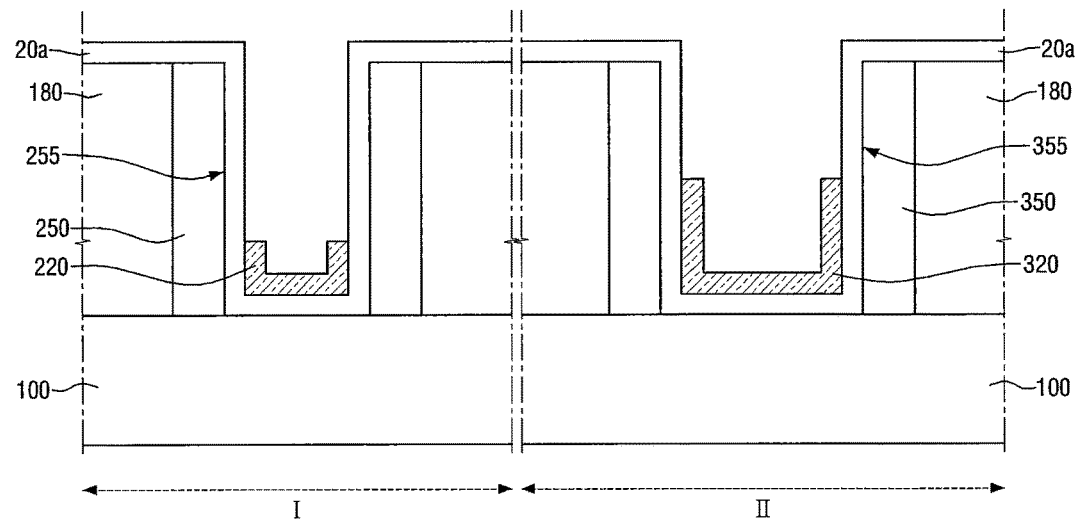

Referring to FIG. 23, a third work function adjustment film 320 can be formed, by chamfering the pre work function adjustment film 30a formed in the second region II of the substrate 100, using the second mask pattern 36.

The third work function adjustment film 320 formed in the second region II of the substrate 100 can be formed on the pre gate insulating film 20a. The third work function adjustment film 320 can be formed along a part of the sidewalls and the bottom surface of the third trench 355.

Subsequently, the second work function adjustment film 220 formed in the first region I of the substrate 100 may be exposed by removing the second mask pattern 36.

Although the configuration has been described in which each of the second work function adjustment film 220 and the third work function adjustment film 320 is formed through the exemplary processes such as FIGS. 21 to 23, but embodiments of the present inventive concepts are not limited thereto. For example, the second work function adjustment film 220 and the third work function adjustment film 320 can be formed by the same manufacturing process.

Figure 24:
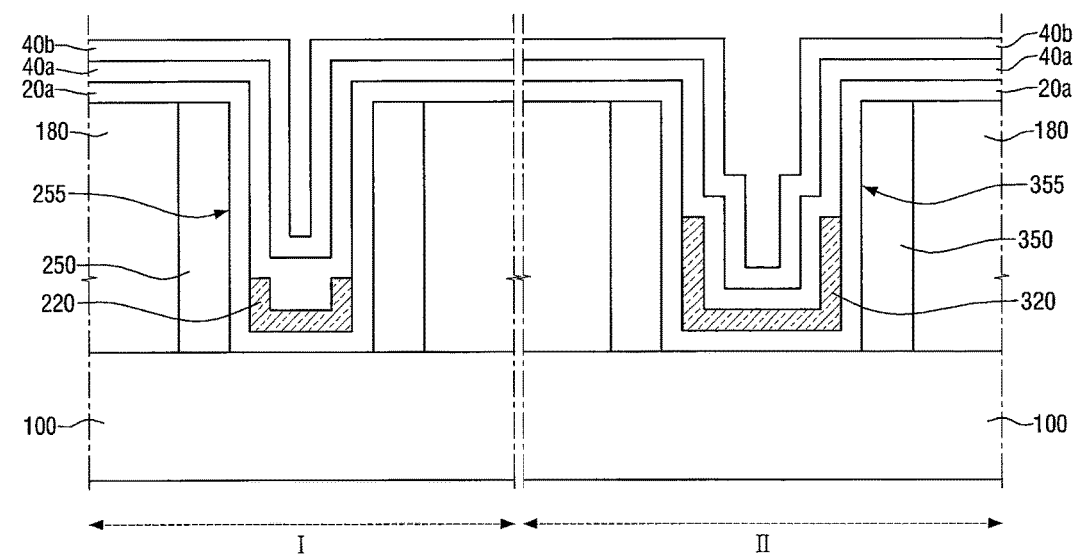

Referring to FIG. 24, a pre lower conductive film 40a can be formed on the pre gate insulating film 20a, along the sidewalls and the bottom surface of the second trench 255, and the sidewalls and the bottom surface of the third trench 355.

The pre lower conductive film 40a can also be formed on the upper surface of the interlayer insulating film 180. Also, the pre lower conductive film 40a is also formed on the second work function adjustment film 220 and the third work function adjustment film 320.

Thus, the pre lower conductive film 40a can extend on or cover the uppermost part of the second work function adjustment film 220 and the uppermost part of the third work function adjustment film 320.

The pre lower conductive film 40a can contain, for example, TiAlC.

Subsequently, it is possible to further form a lower conductive film protective layer 40b on the pre lower conductive film 40a. The lower conductive film protective layer 40b can be formed along the profile of the pre lower conductive film 40a.

The lower conductive film protective layer 40b can contain the same material as a second upper metal film 240 and a third lower filling film 342 to be formed later and can contain, for example, TiN.

The lower conductive film protective layer 40b can reduce or prevent an increase in threshold voltage of the semiconductor device, by protecting the lower conductive film protective layer 40b in the etching process performed later.

Figure 25:
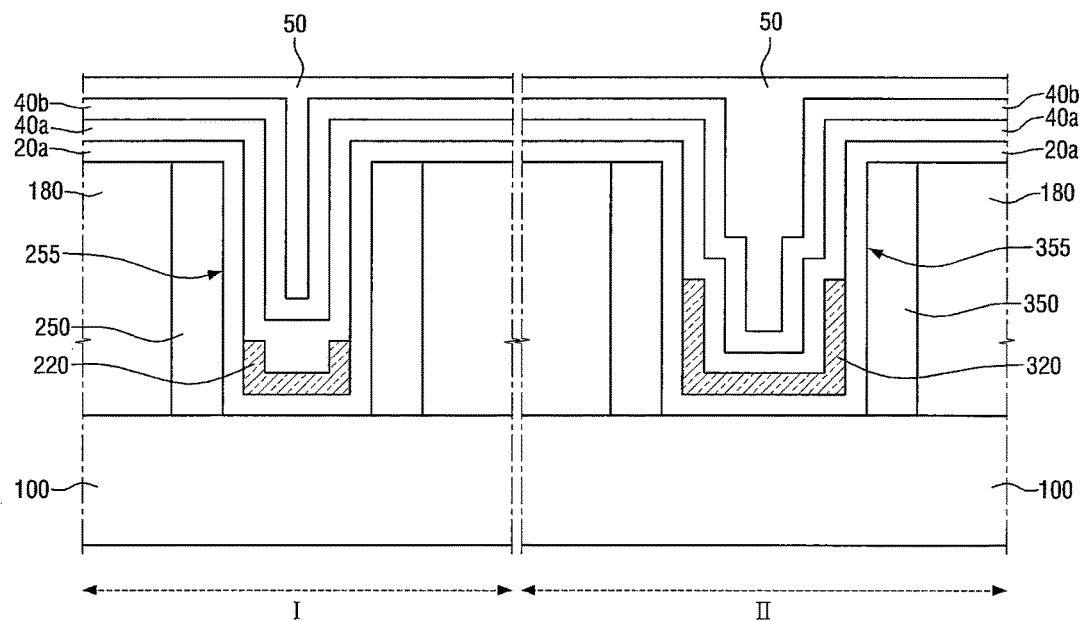

Referring to FIG. 25, a sacrificial film 50 can be formed on the substrate 100.

The sacrificial film 50 can fill the second trench 255 and the third trench 355 in which the lower conductive film protective layer 40b is formed. Also, the sacrificial film 50 can also be formed on the upper surface of the interlayer insulating film 180.

The sacrificial film 50 can contain a material that can fill the narrow space well, that is, a material having excellent gap-filling capability. The sacrificial film 50 can include, for example, spin on carbon (SOC), spin on hardmask (SOH) or the like, but is not limited thereto.

Figure 26:
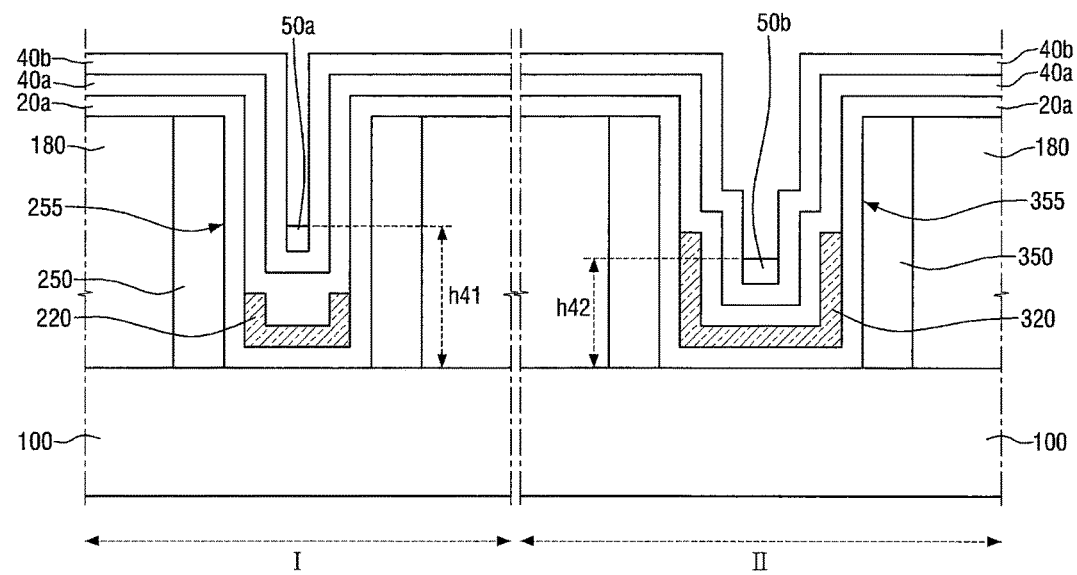

Referring to FIG. 26, a first sacrificial pattern 50a in the first region I of the substrate 100 and a second sacrificial pattern 50b in the second region II of the substrate 100 may be formed by etching the sacrificial film 50.

The first sacrificial pattern 50a can fill a part of the second trench 255 in which the pre lower conductive film 40a and the lower conductive film protective layer 40b are formed. The second sacrificial pattern 50b can fill a part of the third trench 355 in which the pre lower conductive film 40a and the lower conductive film protective layer 40b are formed.

Since the width of the second trench 255 is different from the width of the third trench 355, a height h41 from the bottom surface of the second trench 255 to the upper surface of first sacrificial pattern 50a can be different from a height h42 from the bottom surface of the third trench 355 to the upper surface of the second sacrificial pattern 50b.

If the width of the trench increases, there is less loading effect during the etching process. That is, the portion of the sacrificial film 50 that has filled the third trench 355 may be subject to a lesser loading effect, as compared to the portion of the sacrificial film that has filled the second trench 255.

Thus, the height h41 from the bottom surface of the second trench 255 to the upper surface of the first sacrificial pattern 50a can be greater than the height h42 from the bottom surface of the third trench 355 to the upper surface of the second sacrificial pattern 50b.

Figure 27:
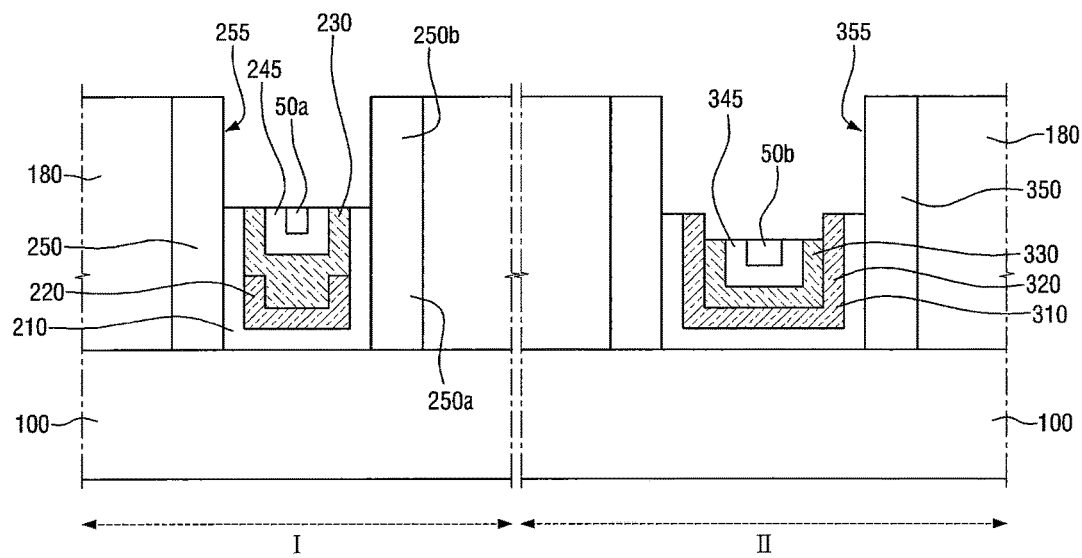

Referring to FIG. 27, the lower conductive film protective layer 40b, the pre lower conductive film 40a and the pre gate insulating film 20a formed in the first region I of the substrate 100 may be etched by using the first sacrificial pattern 50a as a mask.

Further, the lower conductive film protective layer 40b, the pre lower conductive film 40a and the pre gate insulating film 20a formed in the second region II of the substrate 100 may be etched by using the second sacrificial pattern 50b as a mask.

Thus, the second gate insulating film 210 and the second lower conductive film 230 which expose the upper part 250b of the gate spacer can be formed within the second trench 255. Also, the third gate insulating film 310 and the third lower conductive film 330 which expose the upper part 350b of the third gate spacer can be formed within the third trench 355.

Through the etching process, the second gate insulating film 210 can be formed simultaneously with the second lower conductive film 230, and the third gate insulating film 310 can be formed simultaneously with the third lower conductive film 330.

Since the lower conductive film protective layer 40b is also etched through the etching process, a first protective pattern 245 can be formed in the second trench 255, and a second protective pattern 345 can be formed in the third trench 355, respectively.

Figure 28:
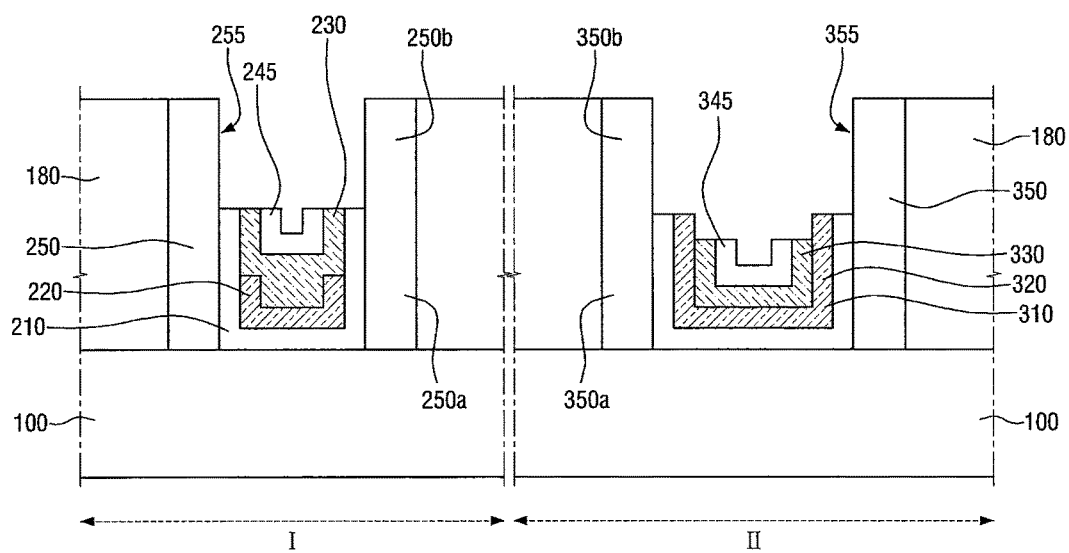

Referring to FIG. 28, the first sacrificial pattern 50a in the second trench 255 and the second sacrificial pattern 50b in the third trench 355 may be removed.

The first sacrificial pattern 50a and the second sacrificial pattern 50b can be removed, for example, through an ashing process and a strip process.

Figure 29:
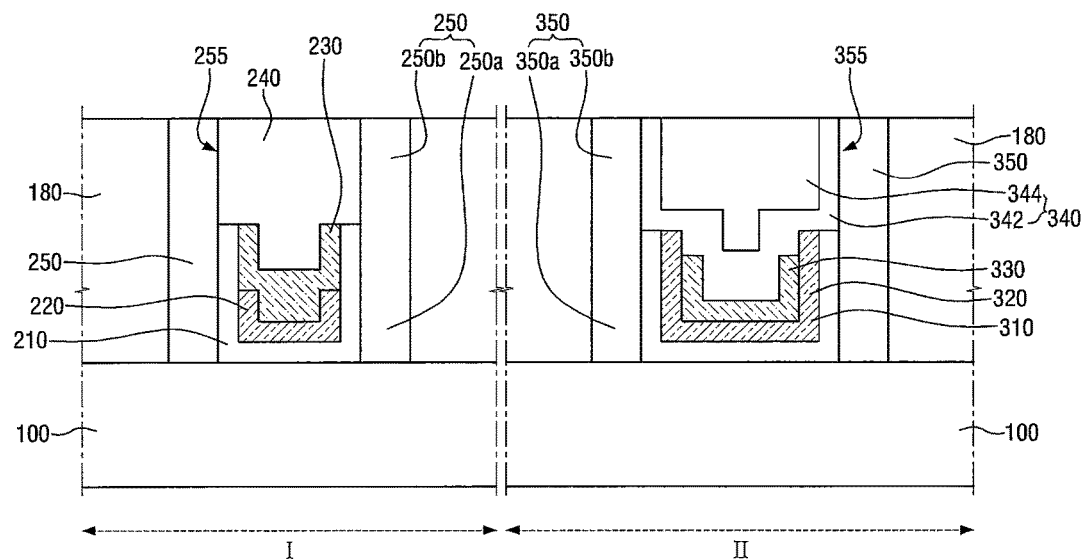

Referring to FIG. 29, the second upper conductive film 240 can be formed on the second lower conductive film 230 of the first region I of the substrate 100.

A second upper conductive film 240 can be formed so as to fill the remainder of the second trench 255. Since the first protective pattern 245 can contain the same material as the second upper conductive film 240, it can be a part of the second upper conductive film 240.

The second upper conductive film 240 can extend on or cover the uppermost part of the second lower conductive film 230 and the uppermost part of the second gate insulating film 210.

A third upper conductive film 340 can be formed on the third lower conductive film 330 of the second region II of the substrate 100.

Specifically, the third upper conductive film 340 can include a third lower filling film 342 and a third upper filling film 344. The third lower filling film 342 can be formed along the upper part of the third gate insulating film 310 and the profile of the third lower conductive film 330. Since the second protective pattern 345 can contain the same material as the third lower filling film 342, it can be a part of the third lower filling film 342.

The third lower filling film 342 can extend on or cover the uppermost part of the third lower conductive film 330 and the uppermost part of the third gate insulating film 310.

The third upper filling film 344 is formed on the third lower filling film 342. The third upper filling film 344 can be formed by filling the remaining portion of the third trench 355.

Methods for fabricating semiconductor devices according to further embodiments of the present inventive concepts will be described through FIGS. 19 to 30.

Figure 30:
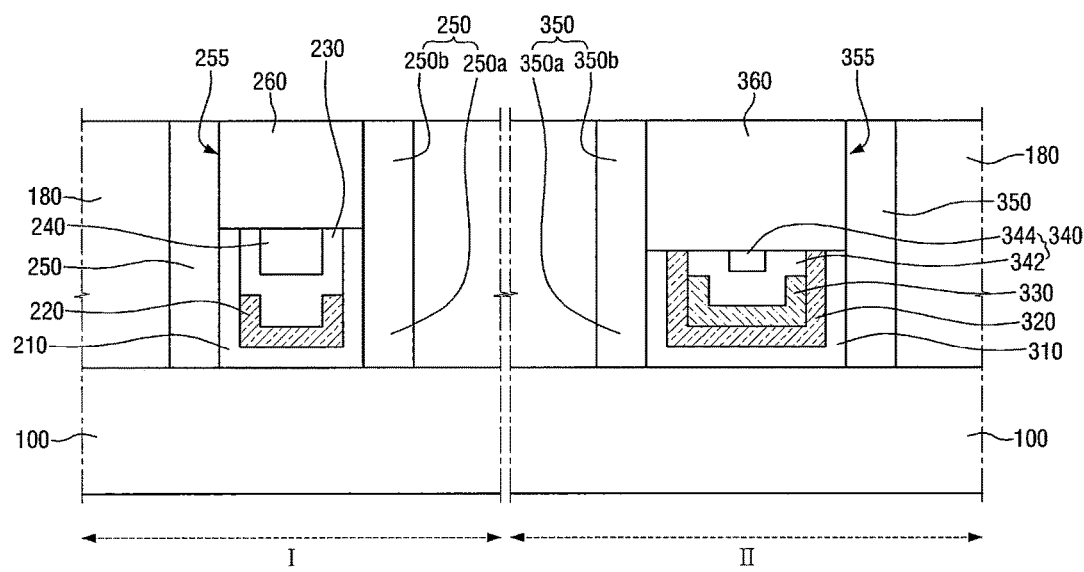
FIG. 30 is a diagram illustrating methods for fabricating semiconductor devices according to further embodiments of the present inventive concepts.

FIG. 30 is a diagram illustrating methods for fabricating semiconductor devices according to further embodiments of the present inventive concepts. Semiconductor devices according to a sixteenth embodiment of the present inventive concepts can be fabricated through FIGS. 19 to 30.

Referring to FIG. 30, the uppermost part of the second gate insulating film 210 and the upper part 250b of second gate spacer may be exposed by removing a part of the second upper conductive film 240.

Subsequently, a second capping pattern 260 which fills the second trench 355 may be formed on the second gate insulating film 210 and the second upper conductive film 240.

In addition, it is possible to expose the uppermost part of the third gate insulating film 310 and the upper part 350b of the third gate spacer, by removing a part of the third upper conductive film 340. More specifically, in order to remove a part of the third upper conductive film 340 a part of the third upper filling film 344 and a part of the third lower filling film 342 may be removed.

Subsequently, a third capping pattern 360 which fills the third trench 355 may be on the third gate insulating film 310, the third upper filling film 344 and the third lower filling film 342.

Figure 31:
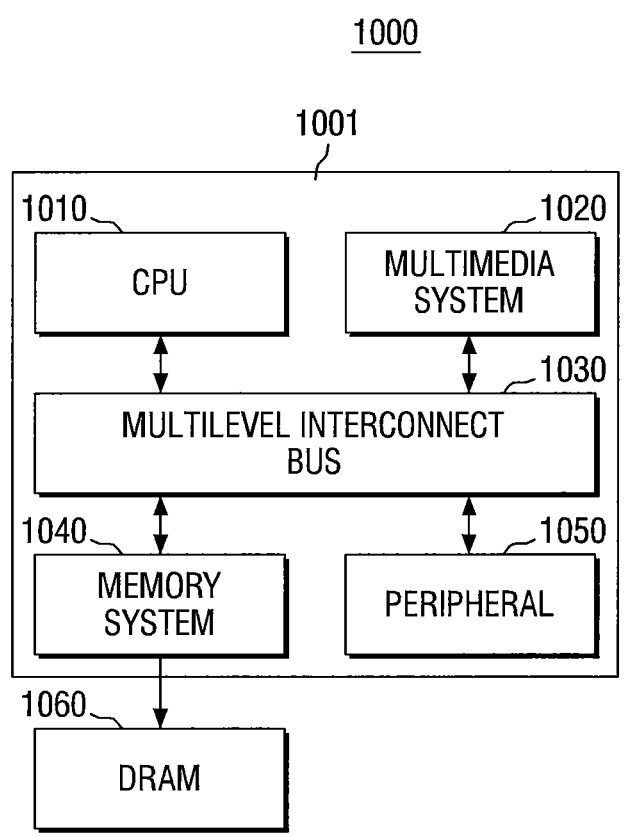
FIG. 31 is a block diagram of a SoC system including the semiconductor device according to embodiments of the present inventive concepts.

FIG. 31 is a block diagram of a SoC (system-on-chip) system including the semiconductor devices according to embodiments of the present inventive concepts.

Referring to FIG. 31, the SoC system 1000 includes an application processor 1001 and a DRAM 1060.

The application processor 1001 can include a central processing unit 1010, a multi-media system 1020, a bus 1030, a memory system 1040 and a peripheral circuit 1050.

The central processing unit 1010 can perform the calculation required for driving of the SoC system 1000. In some embodiments of the present inventive concepts, the central processing unit 1010 can be configured by a multi-core environment that includes a plurality of cores.

The multi-media system 1020 can be used to perform various multi-media functions in the SoC system 1000. The multi-media system 1020 can include a 3D engine module, a video codec, a display system, a camera system, a post-processor and the like.

The bus 1030 can be used to perform the mutual data communication of the central processing unit 1010, the multi-media system 1020, the memory system 1040, and the peripheral circuit 1050. In some embodiments of the present inventive concepts, the bus 1030 can have a multi-layer structure. Specifically, as examples of the bus 1030, a multi-layer AHB (multi-layer Advanced High-performance Bus) or a multi-layer AXI (multi-layer Advanced eXtensible Interface) can be used, but the present disclosure is not limited thereto.

The memory system 1040 can provide an environment in which the application processor 1001 is connected an external memory (e.g., DRAM 1060) to perform the high-speed operation. In some embodiments of the present inventive concepts, the memory system 1040 may include another controller (e.g., DRAM controller) for controlling the external memory (e.g., DRAM 1060).

The peripheral circuit 1050 can provide an environment in which the SoC system 1000 is connected to an external device (e.g., a main board). Thus, the peripheral circuit 1050 can be provided with various interfaces which make the external device connected to the SoC system 1000 compatible.

The DRAM 1060 can function as an operation memory required for operating the application processor 1001. In some embodiments of the present inventive concepts, as illustrated, the DRAM 1060 can be disposed outside the application processor 1001. Specifically, the DRAM 1060 can be packaged in the form of PoP (Package on Package) together with the application processor 1001.

At least one of the components of the SoC system 1000 can include at least one of the semiconductor devices according to the above-described embodiments of the present inventive concepts.

Figure 32:
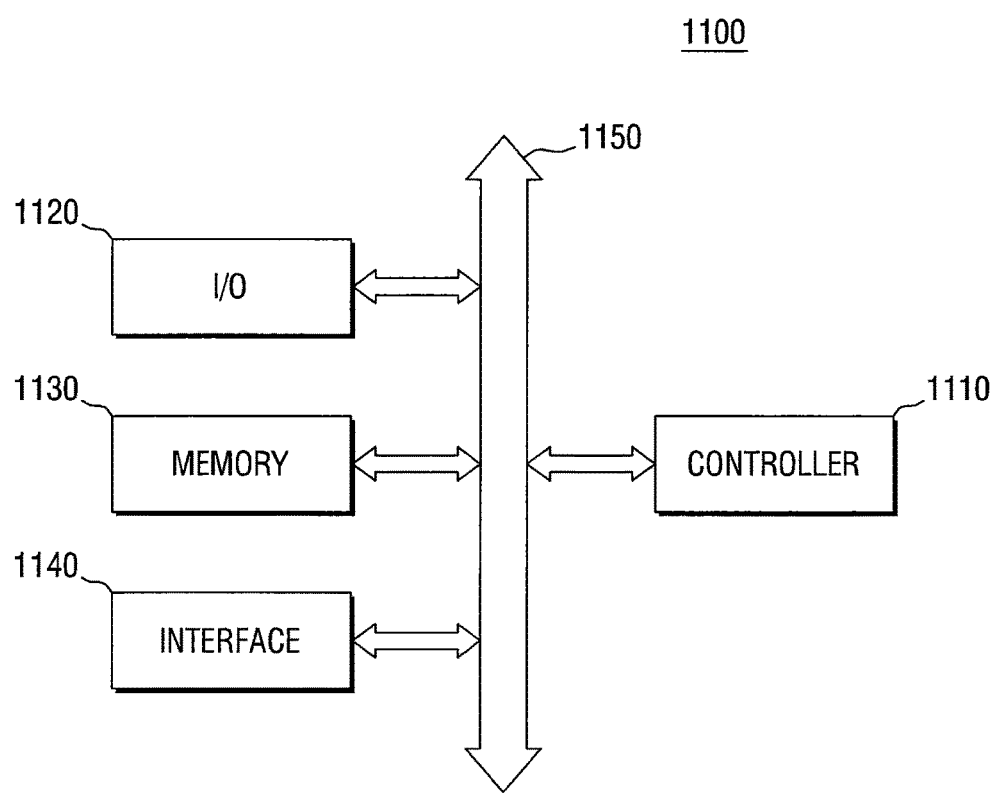
FIG. 32 is a block diagram of an electronic system including the semiconductor devices according to embodiments of the present inventive concepts.

FIG. 32 is a block diagram of an electronic system including the semiconductor devices according to embodiments of the present inventive concepts.

Referring to FIG. 32, the electronic system 1100 according to some embodiments of the present inventive concepts can include a controller 1110, an input/output device (I/O) 1120, a memory device 1130, an interface 1140 and a bus 1150. The controller 1110, the input/output device 1120, the memory device 1130 and/or the interface 1140 can be coupled together via the bus 1150. The bus 1150 corresponds to a path through which the data are moved.

The controller 1110 can include at least one of a microprocessor, a digital signal process, a microcontroller, and logic elements capable of performing the function similar to these elements. The input/output device 1120 can include a keypad, a keyboard, a display device and the like. The memory device 1130 can store data and/or instruction words. The interface 1140 can perform the functions of transferring the data to the communication network or receiving the data from the communication network. The interface 1140 can be in a wired or wireless form. For example, the interface 1140 can include an antenna or a wired and wireless transceiver.

The electronic system 1100 can further include high-speed DRAM and/or SDRAM as an operation memory for improving the operation of the controller 1110.

The semiconductor devices according to the above-mentioned embodiments of the present inventive concepts can be provided inside the memory device 1130 or can be provided as a part of the controller 1110, the input/output device (I/O) 1120 or the like.

The electronic system 1100 can be applied to a personal digital assistant (PDA), a portable computer, a web tablet, a wireless phone, a mobile phone, a digital music player, a memory card or any other electronic products that can transmit and/or receive information in a wireless environment.

Figure 33:
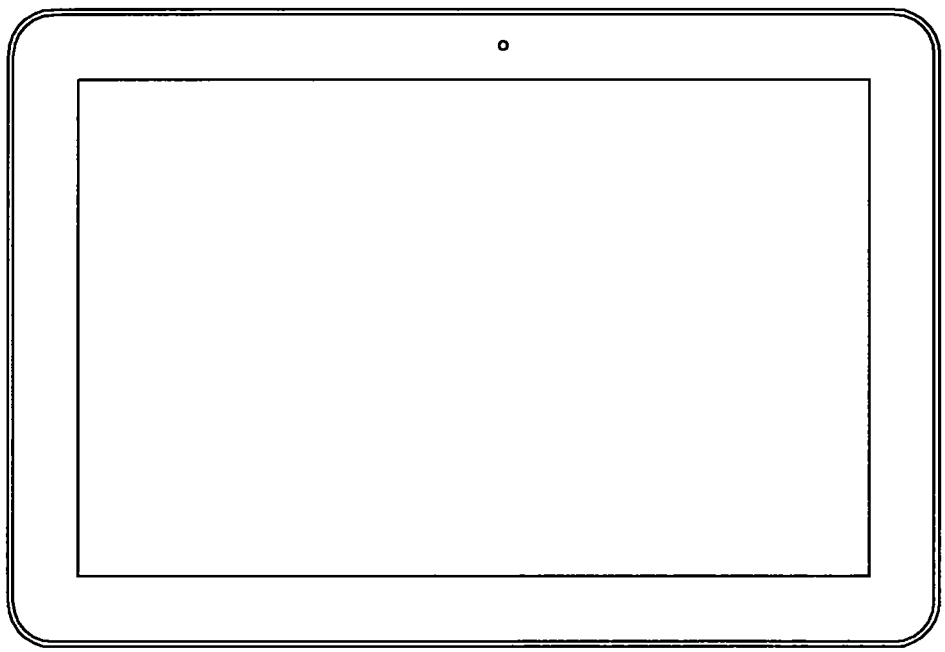
FIGS. 33 to 35 are exemplary semiconductor systems to which the semiconductor devices according to embodiments of the present inventive concepts are applicable.
Figure 34:
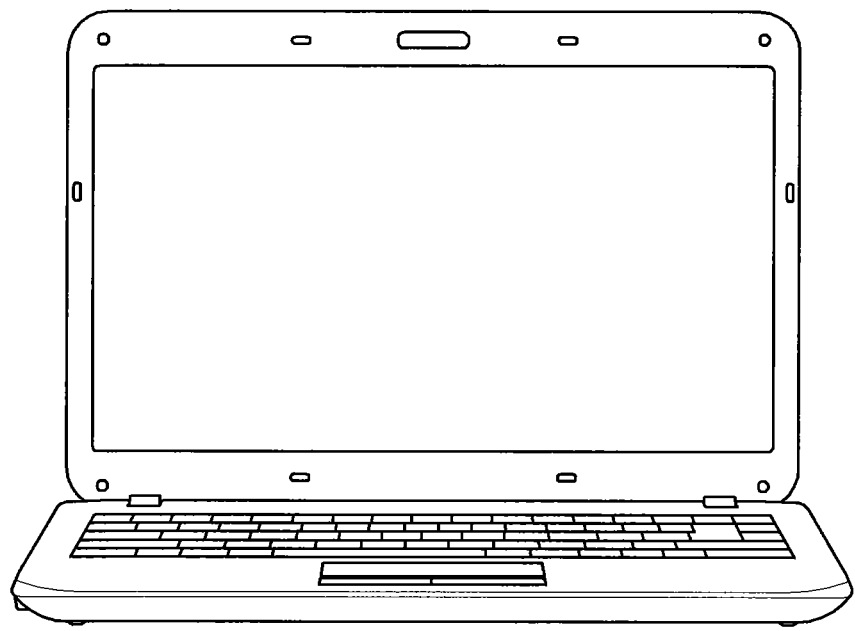
Figure 35:
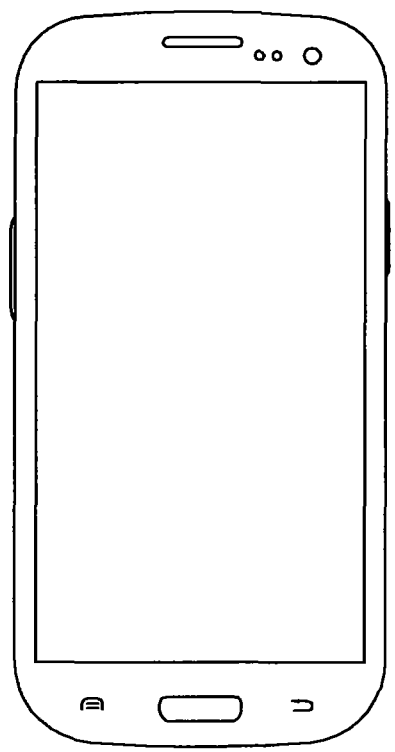

FIGS. 33 to 35 are exemplary semiconductor systems to which the semiconductor devices according to embodiments of the present inventive concepts are applicable.

FIG. 33 is a diagram illustrating a tablet PC 1200, FIG. 34 is a diagram illustrating a laptop computer 1300, and FIG. 35 is a diagram illustrating a smart phone 1400. The semiconductor devices according to the above-described embodiments of the present inventive concepts can be used in the tablet PC 1200, the laptop computer 1300, the smart phone 1400 or the like.

Further, it will be apparent to those skilled in the art that the semiconductor devices according to the above-described embodiments of the present inventive concepts are also applicable to other integrated circuit devices that are not illustrated.

That is, although only the tablet PC 1200, the laptop computer 1300 and the smart phone 1400 are described above as an example of the semiconductor system according to this embodiment, the example of the semiconductor system according to this embodiment is not limited thereto.

In some embodiments of the present inventive concepts, the semiconductor system may be implemented in a computer, an ultra mobile PC (UMPC), a workstation, a net-book, personal digital assistants (PDA), a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, or the like.

Those skilled in the art will appreciate that many variations and modifications can be made to the embodiments without substantially departing from the principles of the present inventive concepts. Therefore, the disclosed embodiments of the present inventive concepts are used in a generic and descriptive sense only and not for purposes of limitation.

What is claimed is:

1. A semiconductor device comprising:
a first gate spacer that defines a first trench on a substrate and includes an upper part and a lower part;
a second gate spacer that defines a second trench on the substrate and includes an upper part and a lower part, a width of the second trench being greater than a width of the first trench;
a first gate insulating film that extends along sidewalls and a bottom surface of the first trench and is not in contact with the upper part of the first gate spacer;
a second gate insulating film that extends along sidewalls and a bottom surface of the second trench and is not in contact with the upper part of the second gate spacer, a height from the bottom surface of the second trench to an uppermost part of the second gate insulating film being different from a height from the bottom surface of the first trench to an uppermost part of the first gate insulating film;
a first gate electrode that includes a first lower conductive film and a first upper conductive film on the first gate insulating film, and fills at least a part of the first trench; and
a second gate electrode that includes a second lower conductive film that extends along the sidewalls and the bottom surface of the second trench and a second upper conductive film that extends on the second lower conductive film and covers the uppermost part of the second gate insulating film, and fills at least a part of the second trench, wherein the second gate electrode further includes a filling conductive film on the second upper conductive film.

2. The semiconductor device of claim 1, wherein the first lower conductive film contains a same material as the second lower conductive film, and the first upper conductive film contains a same material as the second upper conductive film.

3. The semiconductor device of claim 1, wherein the first lower conductive film extends along the sidewalls and the bottom surface of the first trench, and
the first upper conductive film extends on the first lower conductive film and covers the uppermost part of the first gate insulating film and an uppermost part of the first lower conductive film.

4. The semiconductor device of claim 3, wherein the first gate electrode includes a work function adjustment film between the first gate insulating film and the first lower conductive film, and
the first lower conductive film covers an uppermost part of the work function adjustment film.

5. The semiconductor device of claim 1, wherein the second gate electrode includes a work function adjustment film formed between the second gate insulating film and the second lower conductive film, and
a height from the bottom surface of the second trench to an uppermost part of the work function adjustment film is substantially equal to the height from the bottom surface of the second trench to the uppermost part of the second gate insulating film.

6. The semiconductor device of claim 1, wherein the first gate electrode and the second gate electrode fill a part of the first trench and the second trench, respectively, and
the semiconductor device further comprising:
a first capping pattern that fills a remainder of the first trench on the first gate electrode; and
a second capping pattern that fills a remainder of the second trench on the second gate electrode.

7. A semiconductor device comprising:
a fin type pattern that protrudes upward from a field insulating film;
a gate spacer that defines a trench intersecting the fin type pattern on the field insulating film, and includes an upper part and a lower part;
a gate insulating film that extends along sidewalls and a bottom surface of the trench and is not in contact with the upper part of the gate spacer;
a work function adjustment film that extends on the gate insulating film along the sidewalls and the bottom surface of the trench, and is not overlapped with the upper part of the gate spacer;
a lower conductive film that extends on the work function adjustment film along the sidewalls and the bottom surface of the trench, and is not overlapped with the upper part of the gate spacer, the lower conductive film not contacting the gate spacer; and
an upper conductive film on an uppermost part of the gate insulating film and on the lower conductive film.

8. The semiconductor device of claim 7, wherein a height from an upper surface of the field insulating film to the uppermost part of the gate insulating film is higher than a height from the upper surface of the field insulating film to an uppermost part of the fin type pattern and is lower than a height of the gate spacer.

9. The semiconductor device of claim 7, wherein the upper conductive film extends so as to fill a remainder of the trench.

10. A semiconductor device comprising:
a first transistor gate structure comprising:
first gate spacers that define opposing sidewalls of a first trench on a substrate;
a first gate insulating film comprising a high-k dielectric layer conformally extending along the opposing sidewalls of the first trench and on a surface therebetween, wherein portions of the first gate spacers opposite the substrate are free of the first gate insulating film;
a first lower conductive film extending on the first gate insulating film along the opposing sidewalls of the first trench to define a first recess therein, wherein the portions of the first gate spacers opposite the substrate are free of the first lower conductive film, and the first lower conductive film does not contact the first gate spacers;
a work function adjustment film comprising a conductive layer configured to affect a threshold voltage of the semiconductor device extending along the sidewalls of the first trench and between the first gate insulating film and the first lower conductive film, wherein the portions of the first gate spacers opposite the substrate are further free of the work function adjustment film, and at least one of the first gate insulating film and the first lower conductive film extends along the first gate spacers away from the substrate and beyond the work function adjustment film; and a first upper conductive film in the first recess defined by the first lower conductive film, wherein the semiconductor device further comprises:

a second transistor gate structure on the substrate alongside the first transistor gate structure and separated therefrom by an interlayer insulating film having an etch selectivity to the first gate spacers, the second transistor gate structure comprising:

second gate spacers that define opposing sidewalls of a second trench on the substrate;

a second gate insulating film conformally extending along the opposing sidewalls of the second trench and on a surface therebetween, wherein portions of the second gate spacers opposite the substrate are free of the second gate insulating film;

a second lower conductive film extending on the second gate insulating film along the opposing sidewalls of the second trench to define a second recess therein, wherein the portions of the second gate spacers opposite the substrate are free of the second lower conductive film; and a second upper conductive film in the second recess defined by the second lower conductive film, wherein a width of the second trench of the second transistor gate structure is different from that of the first trench of the first transistor gate structure.

11. The semiconductor device of claim 10, wherein the first upper conductive film comprises one or more conductive layers, and wherein at least one of the one or more conductive layers of the first upper conductive film extends outside the first recess.

12. The semiconductor device of claim 11, wherein the first upper conductive film extends directly on the portions of the first gate spacers opposite the substrate that are free of the first gate insulating film and the first lower conductive film.

13. The semiconductor device of claim 10, wherein the portions of the first gate spacers opposite the substrate, which are free of the first gate insulating film and the first lower conductive film, are further free of the first upper conductive film, and further comprising:

an insulating capping pattern on the first upper conductive film and directly on the portions of the first gate spacers that are free of the first gate insulating film, the first lower conductive film, and the first upper conductive film.

14. The semiconductor device of claim 10, wherein one of the first gate insulating film and the first lower conductive film extends along the first gate spacers away from the substrate and beyond the other of the first gate insulating film and the first lower conductive film.

15. The semiconductor device of claim 10, wherein the first gate insulating film extends along the first gate spacers away from the substrate and beyond the work function adjustment film.

16. The semiconductor device of claim 10, wherein the second gate insulating film of the second transistor gate structure extends away from the substrate beyond the first gate insulating film of the first transistor gate structure, and wherein the second recess extends towards the substrate beyond the first recess.

* * * * *